(12) United States Patent
Muneishi

(10) Patent No.: US 11,031,271 B2
(45) Date of Patent: Jun. 8, 2021

(54) HEATER SYSTEM, CERAMIC HEATER, PLASMA TREATMENT SYSTEM, AND ADSORPTION SYSTEM

(71) Applicant: KYOCERA Corporation, Kyoto (JP)

(72) Inventor: Takeshi Muneishi, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 164 days.

(21) Appl. No.: 16/096,314

(22) PCT Filed: Apr. 24, 2017

(86) PCT No.: PCT/JP2017/016229
§ 371 (c)(1),
(2) Date: Oct. 25, 2018

(87) PCT Pub. No.: WO2017/188189
PCT Pub. Date: Nov. 2, 2017

(65) Prior Publication Data
US 2019/0139805 A1 May 9, 2019

(30) Foreign Application Priority Data

Apr. 28, 2016 (JP) .............................. JP2016-092090
Dec. 14, 2016 (JP) .............................. JP2016-242098

(51) Int. Cl.
*H05B 3/68* (2006.01)
*H01L 21/683* (2006.01)
(Continued)

(52) U.S. Cl.
CPC .... *H01L 21/6833* (2013.01); *H01L 21/67103* (2013.01); *H01L 21/67248* (2013.01);
(Continued)

(58) Field of Classification Search
CPC ... H05B 3/00; H05B 3/03; H05B 3/10; H05B 3/141; H05B 3/143; H05B 3/145;
(Continued)

(56) References Cited

U.S. PATENT DOCUMENTS 7,126,092 B2 * 10/2006 Lin .................... H01L 21/67103
219/444.1
2001/0027972 A1 * 10/2001 Yamaguchi ............ H05B 3/283
219/444.1
(Continued)

FOREIGN PATENT DOCUMENTS

JP 2001135460 A 5/2001
JP 2003133195 A 5/2003
(Continued)

*Primary Examiner* — Hung D Nguyen
(74) *Attorney, Agent, or Firm* — Viering, Jentschura & Partner MbB

(57) ABSTRACT

A heater system may include a ceramic heater and a drive device. The ceramic heater may include a ceramic substrate and a resistance heating element. The ceramic substrate may include an upper surface. The resistance heating element may extend in an internal portion or on a surface of the ceramic substrate along the upper surface of the ceramic substrate. The drive device may include a main driving part, which supplies the main power to the entirety of the resistance heating element, and an additional driving part, which supplies additional power to a divided region that is a portion of the resistance heating element, by superimposing it on the main power.

17 Claims, 11 Drawing Sheets

(51) Int. Cl.
*H05B 3/03* (2006.01)
*H05B 3/10* (2006.01)
*H05B 3/00* (2006.01)
*H05B 3/20* (2006.01)
*H01L 21/687* (2006.01)
*H01L 21/67* (2006.01)
*H05B 3/14* (2006.01)
*H05B 3/48* (2006.01)

(52) U.S. Cl.
CPC ...... *H01L 21/687* (2013.01); *H01L 21/68785* (2013.01); *H05B 3/00* (2013.01); *H05B 3/03* (2013.01); *H05B 3/10* (2013.01); *H05B 3/143* (2013.01); *H05B 3/20* (2013.01); *H05B 3/48* (2013.01); *H01L 21/6831* (2013.01)

(58) Field of Classification Search
CPC .......... H05B 3/20; H05B 3/265; H05B 3/283; H05B 3/48; H05B 3/68; H05B 3/74; H05B 2203/002; H05B 2203/003; H05B 2203/013; H05B 2203/014; H05B 2203/016; H05B 2203/017; H05B 2203/037; H01L 21/67103; H01L 21/67109; H01L 21/67115; H01L 21/67248; H01L 21/6732; H01L 21/6831; H01L 21/6833; H01L 21/6835; H01L 21/687; H01L 21/68757; H01L 21/68785
USPC ...... 219/441.1, 466.1, 468.1, 543, 544, 545, 219/546, 547, 548
See application file for complete search history.

(56) References Cited

U.S. PATENT DOCUMENTS

| | | |
|---|---|---|
| 2003/0075537 A1 | 4/2003 | Okajima et al. |
| 2004/0188413 A1 | 9/2004 | Natsuhara et al. |
| 2007/0209933 A1 | 9/2007 | Yoshioka et al. |
| 2010/0000970 A1 | 1/2010 | Koshimizu et al. |

FOREIGN PATENT DOCUMENTS

| | | | |
|---|---|---|---|
| JP | 2004296254 A | | 10/2004 |
| JP | 2005166451 A | | 6/2005 |
| JP | 2007242913 A | | 9/2007 |
| JP | 2010016319 A | | 1/2010 |
| JP | 2014-132560 A | * | 7/2014 |
| JP | 2014132560 A | | 7/2014 |
| JP | 2015-191837 A | * | 11/2015 |
| JP | 2015191837 A | | 11/2015 |

* cited by examiner

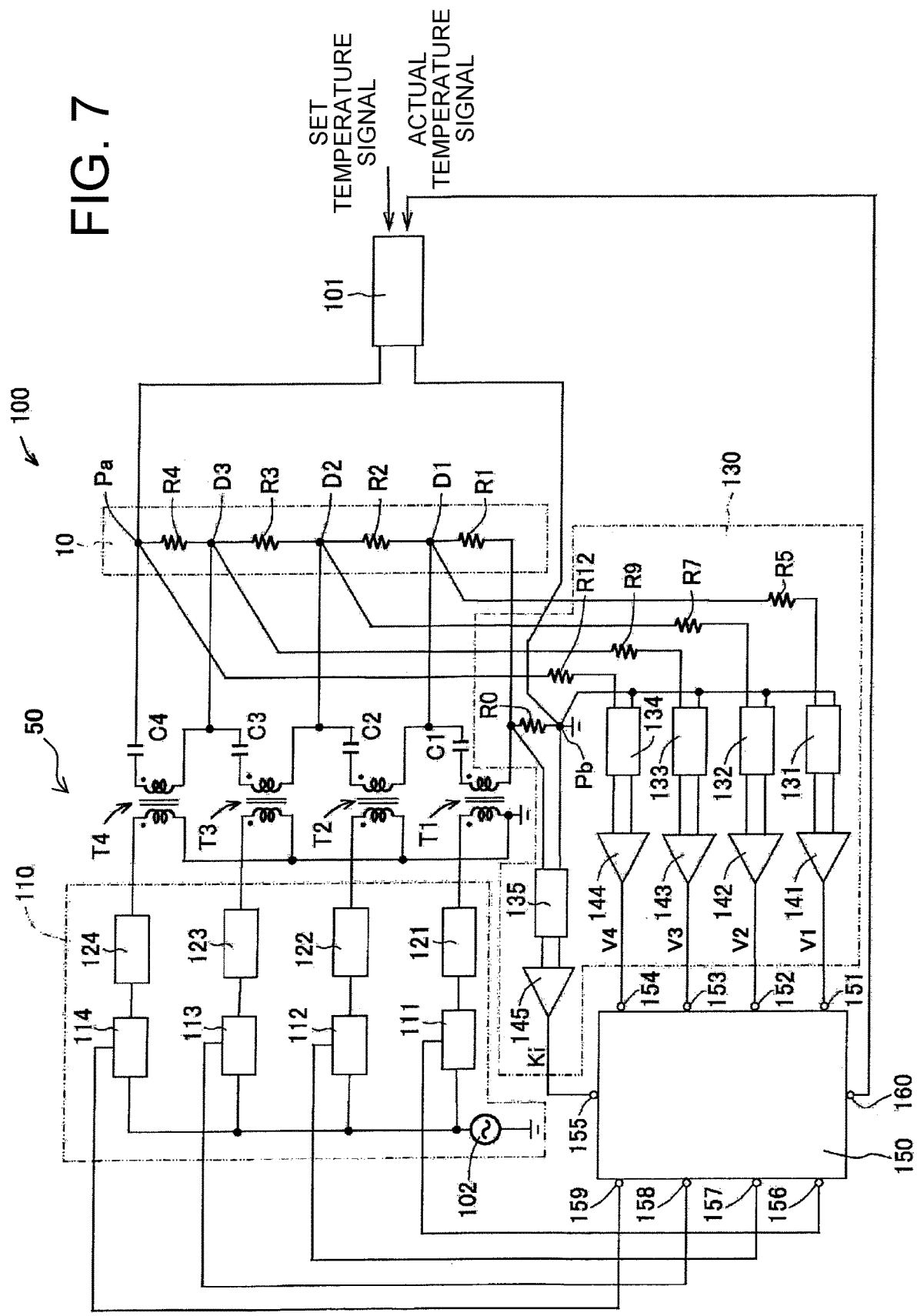

HEATER SYSTEM, CERAMIC HEATER, PLASMA TREATMENT SYSTEM, AND ADSORPTION SYSTEM

CROSS-REFERENCE TO RELATED APPLICATIONS

This application is a national stage entry according to 35 U.S.C. 371 of PCT Application No. PCT/JP2017/016229 filed on Apr. 24, 2017, which claims priority to Japanese Application No. 2016-092090 filed on Apr. 28, 2016, and Japanese Application No. 2016-242098 filed on Dec. 14, 2016, which are entirely incorporated herein by reference.

TECHNICAL FIELD

The present disclosure relates to a heater system, ceramic heater, plasma treatment system, and adsorption system.

BACKGROUND

In semiconductor manufacturing systems and other technical fields, in order to heat semiconductor substrates (below, also referred to as "wafers"), ceramic heaters provided with resistance heating elements on the surfaces or in internal portions of the ceramic substrates may be used.

In the ceramic heater in Patent Literature 1, three or more electrodes are provided with respect to one resistance heating element provided in the ceramic substrate for supplying power to the resistance heating element. Due to this, the resistance heating element is substantially divided into a plurality of regions. Further, an AC power supply is individually provided with respect to each of the plurality of regions.

In the heater system in Patent Literature 2, a plurality of resistance heating elements are provided on/in the ceramic substrate. Further, a control part individually supplies power with respect to each of the plurality of resistance heating elements.

CITATION LIST

Patent Literature

Patent Literature 1: Japanese Patent Publication No. 2005-166451A

Patent Literature 2: Japanese Patent Publication No. 2001-135460A

SUMMARY

A heater system according to one non-limiting aspect of the present disclosure includes a heater including a ceramic substrate including a predetermined surface, and a resistance heating element extending along the predetermined surface in an internal portion or on a surface of the ceramic substrate; and a drive device which supplies power to the resistance heating element. Further, the drive device includes a main driving part which supplies a first power to the entirety of a predetermined first region in the resistance heating element, and an additional driving part which supplies a second power to a second region which is a portion of the first region, superimposed on the first power.

BRIEF DESCRIPTION OF DRAWINGS

FIG. 7 is an example of a functional block diagram for controlling the temperature in the heater system in FIG. 1.

DETAILED DESCRIPTION

In recent years, it is desired to provide a heater system and a ceramic heater capable of suitably controlling the temperature. The ceramic heater and heater system according to various aspects of the present disclosure can suitably control the temperature. Below, the ceramic heater and heater system according to embodiments of the present disclosure will be explained with reference to the drawings.

First Non-Limiting Embodiment (Heater System)

Figure 1:
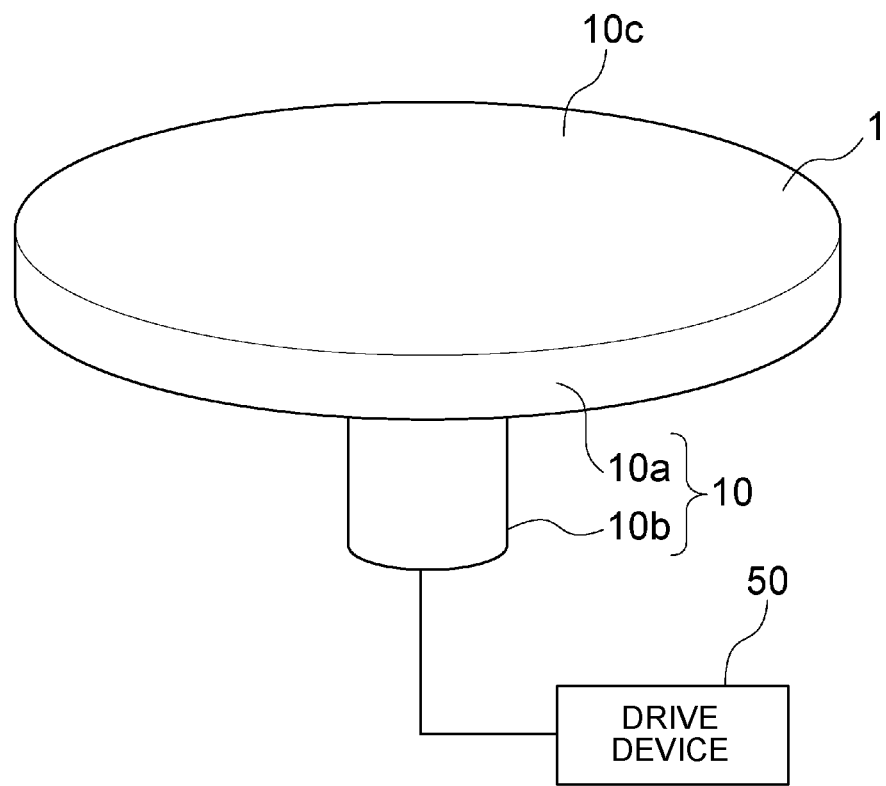
FIG. 1 is a schematic view showing the configuration of a heater system according to a non-limiting embodiment.

FIG. 1 is a schematic view showing the configuration of a heater system 100 according to a non-limiting embodiment.

The heater system 100 has a ceramic heater 10 and a drive device 50 which drives the ceramic heater 10. Below, they will be explained in order.

Note that, the ceramic heater 10 does not have to use the upper part on the drawing sheet in FIG. 1 as the actual upper part. In the following description, for convenience, the upper part on the drawing sheet in FIG. 1 will be defined as the actual upper part, and the "upper surface", "lower surface", and other terms will be sometimes used.

(Ceramic Heater)

The ceramic heater 10, for example, has a substantially plate-shaped (disk-shaped in the example shown) heater body 10a and a pipe 10b extending downward from the heater body 10a.

In the heater body 10a, a wafer is placed on its upper surface 10c as an example of the heated object. The heater body 10a is a portion directly contributing to heating of the wafer. The pipe 10b is for example a portion contributing to support of the heater body 10a and/or protection of a cable (not shown) connected to the heater body 10a. Note that, the ceramic heater may be defined by only the heater body 10a excluding the pipe 10b as well.

The upper surface 10c and lower surface (notation is omitted) of the heater body 10a are for example substantially planes. The planar shape and various dimensions of the heater body 10a may be suitably set considering the shape, dimensions, etc. of the heated object. For example, the planar shape is circular (example shown) or rectangular. When showing an example of the dimensions, the diameter is 20 cm to 30 cm, and the thickness is 5 mm to 30 mm.

The pipe 10b is a hollow member (see FIG. 2 too) that is opened in the upper and lower parts (the two sides of the axial direction). The shapes of the lateral cross-section (cross-section perpendicular to the axial direction) and longitudinal cross-section (cross-section parallel to the axial direction) thereof may be suitably set. In the example shown, the pipe 10b has a cylindrical shape in which the diameter is constant relative to the position in the axial direction. Further, the dimensions of the pipe 10b may be suitably set. However, the lateral cross-section of the pipe 10b is smaller than the lower surface of the heater body 10a. The pipe 10b may be configured by ceramic or another insulation material or may be configured by metal (conductive material).

The pipe 10b is positioned relative to the lower surface of the heater body 10a on the center side of the lower surface. Note that, the "center side" referred to here is for example closer to the center of gravity of the drawing (center) of the heater body 10a (lower surface) than the exact intermediate position between the above center of gravity of the drawing and the outer edge of the heater body 10a. The center of gravity of the drawing is the point where the total sum of primary moments inside the figure becomes 0 and is the center in a circle. The line formed by connecting the intermediate positions described above is a similar figure to the outer edge of the heater body 10a. The pipe 10b is formed by the same material as that for the heater body 10a (strictly speaking, a ceramic substrate 1 which will be explained later). It may be fixed to the heater body 10a by integrally forming it with the heater body 10a or may be prepared separately from the heater body 10a and be fixed to the heater body 10a by screws or other fasteners or a binder.

In a plane perspective, a region defined by an inner edge of the pipe 10b in the heater body 10a becomes a terminal arrangement region 10d (see FIG. 3) in which a plurality of terminals 5 which will be explained later (see FIG. 2) are arranged. The plurality of terminals 5 are exposed from the lower surface of the heater body 10a to the outside of the heater body 10a.

In the pipe 10b, a not shown plurality of cables are inserted. The plurality of cables are connected at single ends to the plurality of terminals 5 and are connected at the other ends to the drive device 50. Due to this, the heater body 10a and the drive device 50 are electrically connected. Note that, the plurality of cables may be bundled to form something like one cable or may not be bundled.

(Internal Structure of Heater Body)

Figure 2:
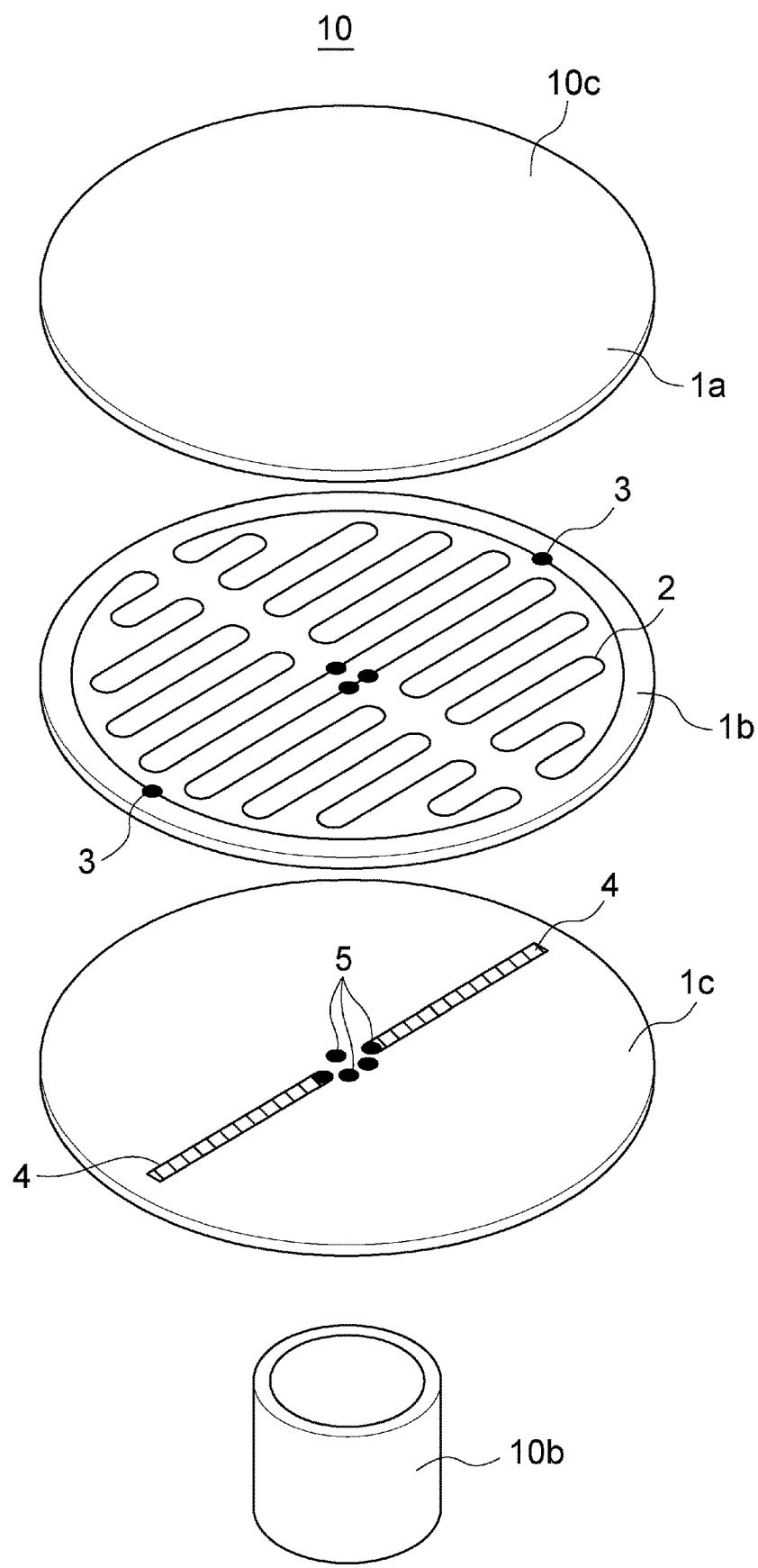
FIG. 2 is a disassembled perspective view of a ceramic heater in the heater system in FIG. 1.

FIG. 2 is a disassembled perspective view of the ceramic heater 10.

Note that, the ceramic heater 10 or heater body 10a after completion is for example integrally formed so that disassembly is impossible. That is, it is not necessary to be able to be disassembled as in the disassembled perspective view in FIG. 2. Further, the ceramic heater 10 or heater body 10a may be prepared by combination of a plurality of members (for example ceramic green sheets) as shown in FIG. 2 or may be prepared according to a method different from such a method.

The heater body 10a is provided with a ceramic substrate 1 (for notation, see FIG. 1. It is configured by 1a, 1b, and 1c in FIG. 2), a resistance heating element 2 buried in the ceramic substrate 1, and various conductors for supplying power to the resistance heating element 2. The various conductors are for example connection conductors 3 (more substantially shown in FIG. 2 to FIG. 4 than those in FIG. 5), wirings 4, and terminals 5. By current flowing in the resistance heating element 2, heat is generated according to Joule's law whereby in turn the wafer placed on the upper surface 10c of the ceramic substrate 1 is heated.

(Ceramic Substrate)

The outer shape of the ceramic substrate 1 configures the outer shape of the heater body 10a. Accordingly, the above explanation concerned with the shape and dimensions of the heater body 10a may be grasped as an explanation of the outer shape and dimensions of the ceramic substrate 1 as they are.

The material of the ceramic substrate 1 may be a ceramic. For example, the ceramic is a sintered body containing as principal ingredients aluminum nitride (AlN), aluminum oxide ($Al_2O_3$), silicon carbide (SiC), silicon nitride ($Si_3N_4$), etc. Note that, an aluminum nitride ceramic containing aluminum nitride as the principal ingredient is for example excellent in corrosion resistance. Accordingly, configuring the ceramic substrate 1 by an aluminum nitride ceramic may be used under a highly corrosive gas atmosphere in a non-limiting aspect of the disclosure.

In FIG. 2, the ceramic substrate 1 is configured by a first ceramic layer 1a to a third ceramic layer 1c. However, as already explained, the ceramic substrate 1 may be prepared by the first ceramic layer 1a to third ceramic layer 1c stacked on each other or may be prepared according to a method different from such a method. Here, for convenience of explanation, it is grasped that the ceramic substrate 1 is configured by the first ceramic layer 1a to third ceramic layer 1c.

The first ceramic layer 1a is a layer configuring the upper surface 10c of the heater body 10a. The third ceramic layer 1c is a layer configuring the lower surface of the heater body 10a. The second ceramic layer 1b is a layer positioned between the first ceramic layer 1a and the third ceramic layer 1c. Each of the first ceramic layer 1a to the third ceramic layer 1c is for example a layer shape (plate shape) having substantially a constant thickness. The planar shapes thereof are the same as the planar shape of the entire heater body 10a (ceramic substrate 1) explained above. The thicknesses of the layers may be suitably set in accordance with the roles of the layers.

(Resistance Heating Element)

The resistance heating element 2 is configured by a conductor pattern positioned between the first ceramic layer 1a and the second ceramic layer 1b. The conductor pattern extends on the upper surface of the ceramic layer 1b (from another viewpoint, the lower surface of the first ceramic layer 1a) along the above upper surface and is substantially linear in shape. As described above, the first ceramic layer 1a has substantially a constant thickness. Further, the resistance heating element 2 extends parallel to the upper surface 10c of the ceramic substrate 1.

Figure 3:
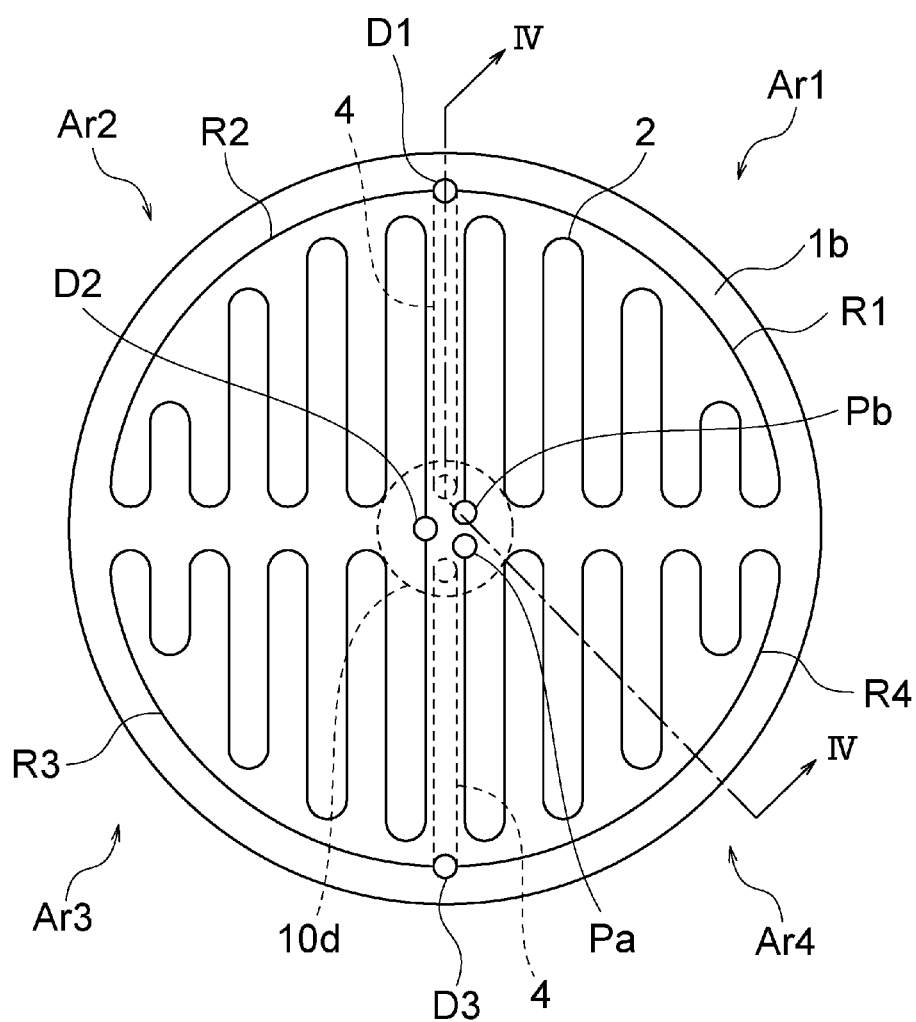
FIG. 3 is a plan view showing an internal portion of the ceramic heater in FIG. 2.

FIG. 3 is a plan view showing the upper surface of the second ceramic layer 1b.

As the resistance heating element 2, for example, only one is provided in the heater body 10a. The resistance heating element 2 extends from one end (first main power supply part Pa) to the other end (second main power supply part Pb) so that it does not cross itself.

The two ends of the resistance heating element 2 become the first main power supply part Pa and second main power supply part Pb (below, sometimes they will be simply referred to as the "main power supply parts P" and the two will not be differentiated) for supplying power to the resistance heating element 2. However, the main power supply parts P may be offset from the two ends of the resistance heating element 2 as well. Further, irrespective of presence/absence of such deviation, the term may be defined so that the term of the "resistance heating element 2" is used with respect to a portion (one example of first region) between the pair of main power supply parts P as well. In the following explanation, for convenience, the "two ends of the resistance heating element 2" and the "pair of main power supply parts P" are regarded as the same in meanings.

Note that, the resistance heating element 2 does not have to have a special configuration in the main power supply parts P (for example becomes pad shaped or the like) and may have the same configuration as the majority of the resistance heating element 2. In FIG. 3, for convenience for clarifying the positions of the main power supply parts P, a via conductor (notation omitted) penetrating through the second ceramic layer 1b is shown at the positions of the main power supply parts P. This via conductor, as will be explained later, configures the connection conductor 3 or terminals 5. However, the resistance heating element 2 may have a special configuration in the main power supply parts P as well.

When viewed on a plane, the positions of the two ends (Pa, Pb) of the resistance heating element 2 and the position and shape of the route of the resistance heating element 2 may be suitably set. For example, the two ends of the resistance heating element 2 fall in the terminal arrangement region 10d explained above.

Further, for example, the resistance heating element 2, when viewed on a plane, extends in the first area Ar1 to fourth area Ar4 (fan-shaped areas in the example shown, below, sometimes they will be simply referred to as the "areas Ar") obtained by dividing the ceramic substrate 1 in a circumferential direction in order. The number of areas divided into and the size relationships of the plurality of areas Ar may be suitably set. In the example shown, the division is equal division. However, it need not be equal division. Further, the equal division is division to four equal parts. However, the equal division is not limited to division to four equal parts. It may be division to two equal parts, division to three equal parts, or division to five or more equal parts.

The route of the resistance heating element 2 in each of the areas Ar may be suitably set. In the example shown, the resistance heating element 2, in the areas Ar, substantially extends in a zigzag manner (meandering state). That is, the resistance heating element 2 extends so as be shifted in position in a predetermined first direction (the right and left direction on the drawing sheet in FIG. 3) while running back and forth in a second direction (up-and-down direction on the drawing sheet in FIG. 3) perpendicular to the first direction.

In more detail, in the example shown, the resistance heating element 2 extends back and forth in a direction parallel to the second direction and is shifted in position in the first direction at the end part of back and forth extension. However, the resistance heating element 2 may be shifted in position in the first direction by extending back and forth obliquely in the second direction as triangle waves. In the example shown, the resistance heating element 1 may be linear shaped parallel to the first direction or may be curved shaped so as to expand toward the outside at the end parts of the back and forth extension.

The first direction (and the second direction perpendicular to this) may be suitably set with respect to each area Ar. In the example shown, the second direction (back and forth direction) is the direction parallel to one of the two border lines (two radii in fan shape) on the two sides of each area Ar. However, the second direction may be a direction parallel to the center line positioned at exactly the middle of the two border lines or may be a direction perpendicular to the center line. Note that, in the example shown, each area Ar is a fan shape having a center angle of 90°. Therefore, when the second direction is parallel to one of the two border lines as described above, the first direction is parallel to the other border line.

The length (reciprocating distance) in the second direction (up-and-down direction on the drawing sheet in FIG. 3) of the resistance heating element 2 may be suitably set. For example, the reciprocating distance changes in accordance with the change of the length in the second direction of each area Ar relative to the position in the first direction (right and left direction on the drawing sheet in FIG. 3) so that the arrangement area of the resistance heating element 2 becomes similar to the shape of the area Ar. Further, the pitch in the first direction of the resistance heating element 2 may be suitably set. The pitch may be constant or may change in accordance with the position in the first direction.

The resistance heating element 2, other than the meandering portion as described above, has a portion extending along the outer edge of the ceramic substrate 1. Due to this, for example, the resistance heating element 2 can be extended from one area Ar to the other area Ar without making the resistance heating element 2 intersect with itself.

The material of the resistance heating element 2 is a conductor (for example a metal) generating heat by flow of current. The conductor may be suitably selected. It is for example tungsten (W), molybdenum (Mo), platinum (Pt), or indium (In) or alloys containing them as principal ingredients. As will be explained later, in the present non-limiting embodiment, the resistance heating element 2 is used also as a sensor element (thermistor) which detects the temperature. When use is made of tungsten or an alloy containing tungsten as the principal ingredient as the material of the resistance heating element 2, for example, tungsten has a relatively high temperature coefficient of resistance, therefore the detection precision of the temperature is improved.

(Branched Power Supply Parts)

The resistance heating element 2 has one or more branched power supply parts (first branched power supply part D1 to third branched power supply part D3, below, sometimes they will not be differentiated and will be simply referred to as the "branched power supply parts D") for supplying power to the resistance heating element 2 between the pair of main power supply parts P (from another viewpoint, at intermediate positions in the resistance heating element 2). Accordingly, in the resistance heating element 2, the power can be supplied to a portion between one main power supply part P and one branched power supply part D or between the two branched power supply parts D. That is, in the resistance heating element 2, it is possible to partially supply power. From another viewpoint, the resistance heating element 2 has a first divided region R1 to fourth divided region R4 (each is one example of the second region, below, sometimes they will not be differentiated and will be simply referred to as the "divided regions Rn") punctuated by the branched power supply parts D in the portion (one example of the first region) between the pair of main power supply parts P.

Note that, even if the resistance heating element 2 has the branched power supply parts D, in the same way as the main power supply parts P, the resistance heating element 2 does not have to have a special configuration (for example pad etc.) in the branched power supply parts D. The branched power supply parts D may be the same in configuration as the other majority of the resistance heating element 2. In FIG. 3, in the same way as the main power supply parts P, for convenience, via conductors (notations are omitted, connection conductors 3) penetrating through the second ceramic layer 1b are shown at the positions of the branched power supply parts D.

However, the resistance heating element 2 may have a special configuration in the branched power supply parts D as well. For example, the branched power supply parts D may be configured by a material (for example the material configuring the connection conductors 3) different from the material configuring the other majority of the resistance heating element 2 as well. That is, from the viewpoint of the material, a plurality of resistance heating elements may be connected in series to configure the resistance heating element 2 as well. In this case as well, the power can be supplied to the entirety of the resistance heating element 2 by the potential difference of the pair of main power supply parts P. Accordingly, in the present disclosure, the explanation will be given assuming that there is one resistance heating element 2. Further, the branched power supply parts D will be regarded as a portion of the resistance heating element 2. This is true also for the main power supply parts P.

The number of branched power supply parts D (number of the divided regions Rn), relative positions of branched power supply parts D to the main power supply part P or to other branched power supply parts D on the route of the resistance heating element 2 (length of the divided regions Rn), and the positions of the branched power supply parts D relative to the ceramic substrate 1 (positions of the divided regions Rn relative to the ceramic substrate 1) may be suitably set. In the example shown, they are as follows.

As the branched power supply parts D, for example, three in total are provided. Further, on the route of the resistance heating element 2, from the second main power supply part Pb to the first main power supply part Pa, the first branched power supply part D1, second branched power supply part D2, and third branched power supply part D3 are positioned in that order. Consequently, four divided regions Rn in total are provided. Further, on the route of the resistance heating element 2, from the second main power supply part Pb to the first main power supply part Pa, the first divided region R1, second divided region R2, third divided region R3, and fourth divided region R4 are positioned in that order.

The plurality of (three in the example shown) branched power supply parts D are for example provided on the route of the resistance heating element 2 so as to substantially equally divide the length between the pair of main power supply parts P (divide to four equal parts in the example shown). That is, the lengths of the plurality of divided regions Rn are substantially equal to each other. When referring to "substantially equal", for example, it means a difference between the length of each of the plurality of divided regions Rn and the length obtained by strictly equally dividing the length between the pair of main power supply parts P is 10% or less of the latter.

The plurality of divided regions Rn are for example set so as to be substantially positioned in the plurality of areas Ar. Specifically, this is as follows The resistance heating element 2 extends from the second main power supply part Pb in the terminal arrangement region 10d to the first area Ar1. Further, the first branched power supply part D1, for example, is positioned, in the portion where the resistance heating element 2 extends from the first area Ar1 to the second area Ar2 along the outer edge of the ceramic substrate 1, at the boundary of the two areas Ar. Due to this, the first divided region R1 extends substantially in the first area Ar1.

Further, the second branched power supply part D2, for example, is positioned, in the portion where the resistance heating element 2 extends from the second area Ar2 to the third area Ar3 in the terminal arrangement region 10d, at the boundary of the two areas Ar. Due to this, the second divided region R2 substantially extends in the second area Ar2.

Further, the third branched power supply part D3, for example, is positioned, in the portion where the resistance heating element 2 extends from the third area Ar3 to the fourth area Ar4 along the outer edge of the ceramic substrate 1, at the boundary of two areas Ar. Due to this, the third divided region R3 substantially extends in the third area Ar3.

Further, the resistance heating element 2 passes through the fourth area Ar4 from the third branched power supply part D3 and extends to the first main power supply part Pa in the terminal arrangement region 10d. Due to this, the fourth divided region R4 substantially extends in the fourth area Ar4.

(Connection Conductors, Wirings, and Terminals)

Figure 4:
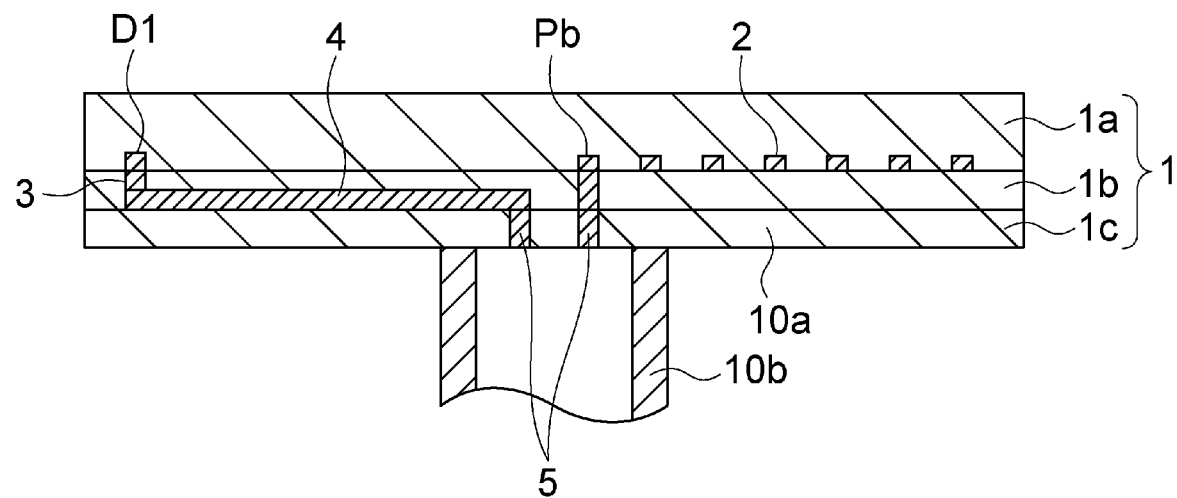
FIG. 4 is a cross-sectional view taken along the IV-IV line in FIG. 3.

FIG. 4 is a cross-sectional view taken along the IV-IV line in FIG. 3.

The connection conductors 3, wirings 4, and terminals 5 shown in FIG. 2 and FIG. 4 are ones for supplying power to the resistance heating element 2 and are provided in the ceramic substrate 1. The wirings 4 become hierarchical wirings positioned in the lower layer relative to the resistance heating element 2 and connects any of the plurality of power supply parts (P and D) and any of the plurality of terminals 5. The connection conductors 3 are interposed between the wirings 4 and the power supply parts and contribute to connection of them. By the provision of such hierarchical wirings, for example, it becomes possible to connect any position (power supply part) of the resistance heating element 2 and a terminal positioned at any position.

More specifically, for example, the terminals 5, as already explained, are exposed from the lower surface of the ceramic substrate 1 to the outside of the ceramic substrate 1 in a portion of the region on the center side in a planar view of the ceramic substrate 1 constituting the terminal arrangement region 10d (FIG. 3). Further, for example, among the main power supply parts P and branched power supply parts D, ones positioned outside of the terminal arrangement region 10d (D1 and D3 in the present non-limiting embodiment) are connected through the connection conductors 3 and wirings 4 to the terminals 5. On the other hand, among the main power supply parts P and branched power supply parts D, ones positioned in the terminal arrangement region 10d (Pa, Pb, and D2 in the present non-limiting embodiment) are for example directly connected to the terminals 5 without going through the wirings 4.

The connection conductors 3 are for example configured by via conductors penetrating through the second ceramic layer 1b. Further, by positioning them right under the first branched power supply part D1 and the third branched power supply part D3, they are connected to these power supply parts. In other words, the connection conductors 3 project from the power supply parts of the resistance heating element 2 to the side opposite to the upper surface 10c of the ceramic substrate 1 in the internal portion of the ceramic substrate 1.

The wiring 4 is for example configured by a conductor pattern positioned between the second ceramic layer 1b and the third ceramic layer 1c. That is, the wiring 4 is buried in the ceramic substrate 1. The dimensions and shape of the wiring 4 may be suitably set. In the example shown, the wiring 4 linearly extends with substantially a constant width. Further, when viewed on a plane, the terminals 5 are positioned in a portion on the center side of the ceramic substrate 1 constituting the terminal arrangement region 10d and the first branched power supply part D1 and the third branched power supply part D3 are positioned outside of the terminal arrangement region 10d. Corresponding to such a configuration, the wiring 4 substantially extends in a radial direction of the ceramic substrate 1. Note that, as already explained, each of the first ceramic layer 1a and the second ceramic layer 1b has substantially a constant thickness, therefore the wiring 4 extends parallel to the upper surface 10c of the ceramic substrate 1.

Among the plurality of terminals 5, one connected to the wiring 4 is for example configured by a via conductor penetrating through the third ceramic layer 1c. Further, this terminal 5 is connected to the wiring 4 by being positioned right under the wiring 4 at substantially the end part of the wiring 4 on the side opposite to the connection conductor 3.

Among the plurality of terminals 5, ones directly connected to the power supply parts (Pa, Pb, and D2) are for example configured by via conductors penetrating through the second ceramic layer 1b and third ceramic layer 1c. Further, these terminals 5 are connected to the power supply parts (Pa, Pb, and D2) by being positioned right under the resistance heating element 2. The portions penetrating through the second ceramic layer 1b in these terminals 5 may be grasped as the connection conductors 3 as well.

Note that, although particularly not shown, all terminals 5 may further have pads (layer-shaped conductors) positioned on the lower surface of the ceramic substrate 1 as well.

The materials for the connection conductors 3, wirings 4, and terminals 5 may be made suitable conductors (for example metals). For example, the materials are copper (Cu) or aluminum (Al) or alloys containing them as principal ingredients. Further, the materials of these members may be the same as the material for the resistance heating element 2 as well. The surfaces of the terminals 5 which are exposed to the outside may be covered by a metal excellent in bonding property and/or corrosion resistance as well.

The via conductors configuring the connection conductors 3 (the same also for divided conductors 3a which will be explained later) and the terminals 5 may be the same as the various conductors used in a multilayer wiring board. The via conductors may be conductors filled in holes formed in the ceramic layers as well (the conductors may be solid). Further, the via conductors may be conductors formed on the inner circumferential surfaces in the holes described before as well (the conductors may be hollow). However, if it is solid, it is easy to secure the conduction area. In the internal portions of the hollow via conductors, an insulation material may be filled in portions or the entirety of the same as well. Further, the via conductors may be constant in diameter or may change in diameter (for example may be tapered shaped or inversely tapered shaped) as well. Also, the shapes of the cross-sections perpendicular to the penetration direction may be suitably set. For example, the shapes may be circular. In a case where the via conductors penetrate through two or more ceramic layers, the via conductors may be prepared by superimposing conductors penetrating through the ceramic layer on each other or may be prepared so as to penetrate through two or more ceramic layers.

In the connection parts of the via conductors (connection conductors 3 and terminals 5) and the layer-shaped pattern (resistance heating element 2 and wirings 4), from the viewpoint of the material or manufacturing process etc., the via conductors may be connected to the upper surface or lower surface of the layer-shaped pattern or the layer-shaped pattern may be connected to the peripheries of the via conductors. Such differentiation may be impossible as well. In the explanation of the present disclosure, for convenience, in any case, the explanation will be given by conceptually grasping that the connection conductors 3 and/or terminals 5 are connected to the upper surfaces or lower surfaces of the resistance heating element 2 and wirings 4.

Figure 5:
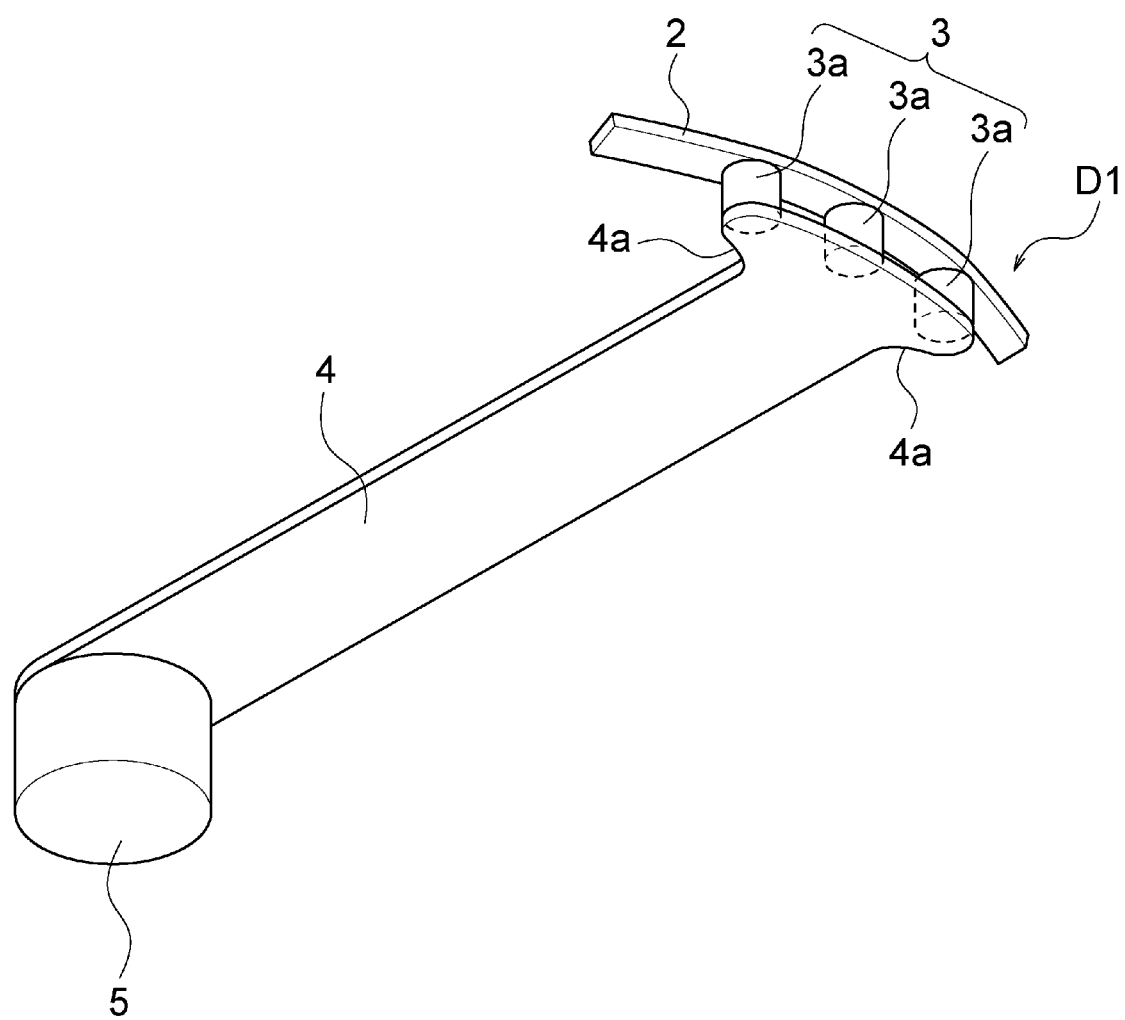
FIG. 5 is an enlarged perspective view showing wiring inside the ceramic heater in FIG. 2 and its periphery.

FIG. 5 is a perspective view showing the wiring 4 and its periphery in an enlarged manner.

Each connection conductor 3 includes a plurality of (three in the example shown) divided conductors 3a. The plurality of divided conductors 3a are positioned along the route of the resistance heating element 2 and are connected in parallel between one power supply part (D1 or D3 in the present non-limiting embodiment) and one wiring 4. Due to this, it becomes easier to secure the conduction area of the resistance heating element 2 and the wiring 4. Each divided conductor 3a, as explained above in the explanation of the connection conductors 3, for example, is configured by a via conductor penetrating through the second ceramic layer 1b.

The shape and dimensions of each divided conductor 3a may be suitably set. For example, the via conductor configuring the divided conductor 3a, as already explained, may be the same as one used in the multilayer wiring board. As an example, it is substantially columnar in shape. Further, the diameter (for example maximum diameter) of each divided conductor 3a is for example substantially equal to the width of the resistance heating element 2. When referring to "substantially equal", it means, for example, the difference of the two is 10% or less of the width of the resistance heating element 2. Naturally, the diameter of the divided conductor 3a need not be equal to the width of the resistance heating element 2 either. When showing an example of dimensions, for example, the width of the resistance heating element 2 is 1 mm to 10 mm. Further, for example, the diameter of the divided conductor 3a (columnar shape) is 1 mm to 7 mm.

The number, relative positions, etc. of the plurality of divided conductors 3a may be suitably set. The number of the divided conductors 3a may be two or four or more as well unlike the example shown. The relative positions of the plurality of divided conductors 3a corresponding to one power supply part are defined according to the route of the resistance heating element 2 since the plurality of divided conductors 3a are aligned along the route of the resistance heating element 2. In the example shown, the power supply part (D1 or D3) is positioned in the portion where the resistance heating element 2 forms an arc having a relatively large curvature radius, therefore the plurality of divided conductors 3a are substantially linearly aligned. According to the shape of the route of the resistance heating element 2 and the position of the power supply part, the three divided conductors 3a are for example arranged in a triangular shape. The interval of the plurality of divided conductors 3a corresponding to one power supply part may be suitably set. Further, the interval may be relatively narrow. Even if the plurality of divided conductors 3a are short-circuited with each other, no electrical inconvenience arises.

The wiring 4 is for example configured so that its cross-sectional area (when not particularly indicated, the area of the lateral cross-section (cross-section perpendicular to the route), the same true also for the resistance heating element 2) becomes larger than the cross-sectional area of the resistance heating element 2. In more detail, for example, the wiring 4 is made broader in the width in comparison with the width of the resistance heating element 2. Due to this, the cross-sectional area of the wiring 4 becomes larger than the cross-sectional area of the resistance heating element 2. Note that, so far as the cross-sectional area of the wiring 4 is larger than the cross-sectional area of the resistance heating element 2, the thickness of the wiring 4 may be thinner, equal to, or thicker as well relative to the thickness of the resistance heating element 2. Note that, when referring to "the thickness of the wiring 4 is substantially equal to the thickness of the resistance heating element 2", it means, for example, the difference of the two is 10% or less of the thickness of the resistance heating element 2.

The degree of size of the cross-sectional area of the wiring 4 may be suitably set in comparison with the cross-sectional area of the resistance heating element 2. For example, the cross-sectional area of the wiring 4 is 2 times or more or 5 times or more of the cross-sectional area of the resistance heating element 2. In the same way, the width of the wiring 4 is for example 2 times or more or 5 times or more of the width of the resistance heating element 2. When showing an example of dimensions, the width of the resistance heating element 2 is 1 mm to 10 mm, and the thickness of the resistance heating element 2 is 10 μm to 150 μm. The width of the wiring 4 is about 10 times of that of the resistance heating element 2, and the thickness of the wiring 4 is the same degree as the thickness of the resistance heating element 2 (the cross-sectional area of the wiring 4 is about 10 times of the cross-sectional area of the resistance heating element 2).

The shape of the wiring 4 in a connection part with the connection conductor 3 may be suitably set so that connection with the plurality of divided conductors 3a becomes possible. In the example shown, the plurality of divided conductors 3a are substantially arranged along the width direction of the wiring 4 and the lengths of arrangement of the plurality of divided conductors 3a are larger than the width of the wiring 4. Corresponding to this configuration, the connection part of the wiring 4 with the connection conductor 3 has two branch portions 4a extending to the two sides of the width direction. Note that, corresponding to the arrangement of the plurality of divided conductors 3a, such a branch portion 4a need not be provided, or the branch portions 4a may extend to suitable directions. Further, the branch portion 4a need not be provided, but pad-shaped portions may be formed as well.

The terminals 5 are for example made larger in their diameters in comparison with the divided conductors 3a. For example, the diameter of the terminal 5 is 2 times or more of the diameter of the divided conductor 3a. Further, from another viewpoint, the diameter of the terminal 5 is for example substantially equal to the width of the wiring 4. When referring to "substantially equal", it means, for example, the difference of the two is 10% or less of the width of the wiring 4.

FIG. 5 shows a terminal 5 connected to the wiring 4. However, the shape and dimensions of a terminal 5 which is directly connected to power supply parts (Pa, Pb, and D2) in the explanation, excluding the length in its axial direction (thickness direction of the ceramic substrate 1), are the same as those of the terminal shown in FIG. 5.

However, a terminal 5 which is directly connected to the power supply part in the explanation (from another viewpoint, a terminal 5 connected to a power supply part positioned in the terminal arrangement region 10d), in the same way as a terminal 5 connected to a power supply part outside the terminal arrangement region 10d, may be connected through a plurality of divided conductors 3a provided in the second ceramic layer 1b to the power supply part as well (the portion in the third ceramic layer 1c may be defined as a terminal 5 as well). In this case, when viewed on a plane, the plurality of divided conductors 3a may fall in the terminal 5 as well. When they do not fall into the latter, in the same way as the outside of the terminal arrangement region 10d, the layer-shaped pattern corresponding to the wiring 4 may be interposed between the plurality of divided conductors 3a and the terminal 5 as well.

(Drive Device)

The drive device 50 shown in FIG. 1 is configured including for example a power supply circuit and IC (integrated circuit, from another viewpoint, a computer) and the like. It converts power from a commercial power source to an AC power and/or DC power having a suitable voltage and supplies the result to the ceramic heater 10 (plurality of terminals 5). The IC is provided with for example a CPU, ROM, RAM, and external memory device. By the CPU running a program stored in the ROM etc., various types of functional parts such as the control part are configured. Note that, the control part etc. may be configured by combining circuits performing predetermined computation processing as well. The processing carried out by the drive device 50 may be digital processing or may be analog processing.

(Outline of Control Method)

Figure 6A:
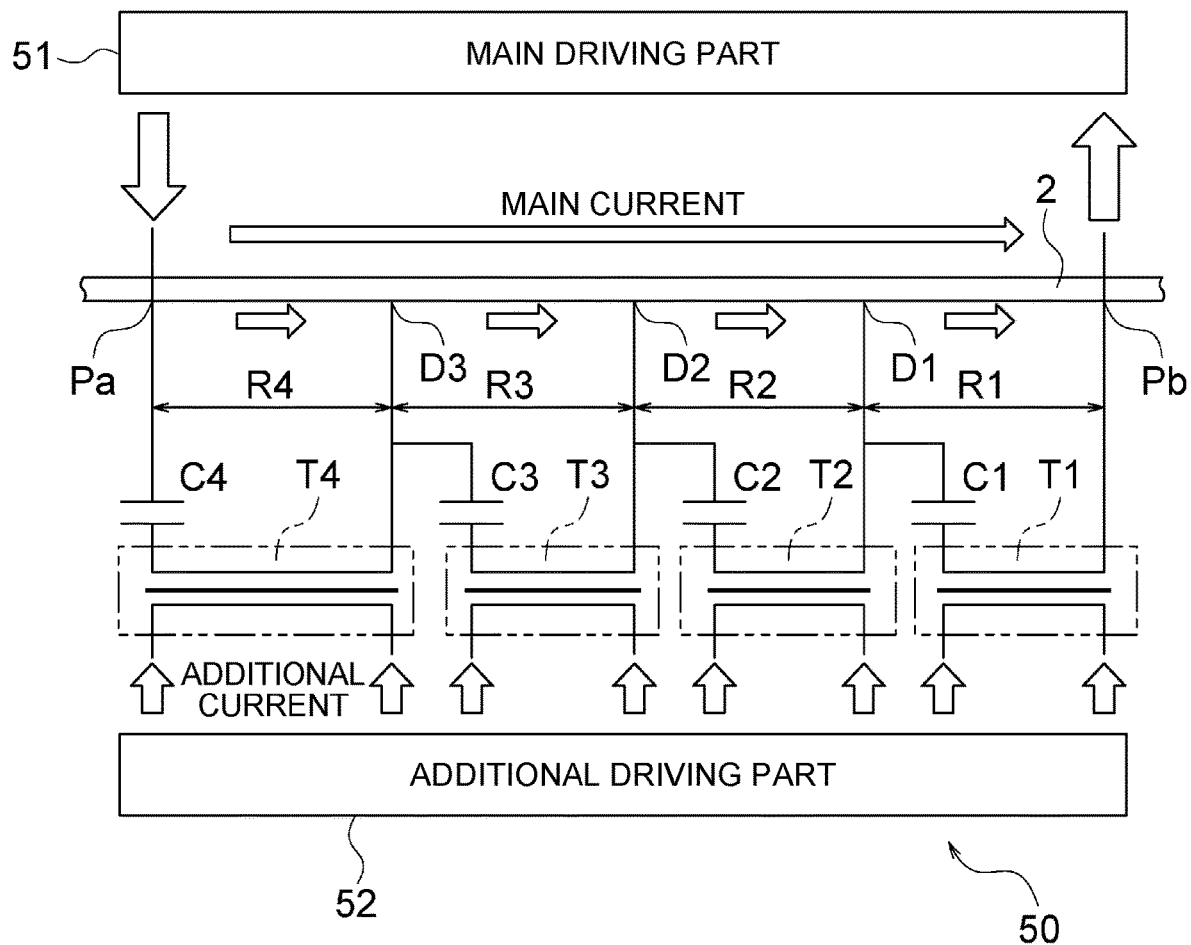
FIG. 6A is a schematic view showing an outline of the configuration of a control system in the heater system in FIG. 1.

FIG. 6A is a schematic view showing an outline of the configuration of the control system in the heater system 100.

In this view, in the upper part on the drawing sheet, the resistance heating element 2 is substantially shown by the white line extending in the right and left direction. The two ends thereof form a pair of main power supply parts P. A plurality of branched power supply parts D are positioned in the middle. The notations and figures on the periphery of the resistance heating element 2 substantially show the components of the drive device 50.

The drive device 50 has for example a main driving part 51 and additional driving part 52. The main driving part 51 supplies the main power (one example of first power, main current) to the portion between the pair of main power supply parts P. That is, the main driving part 51 supplies the main power to the entirety of the resistance heating element 2. Further, the additional driving part 52, for example, individually supplies additional power (one example of second power, additional current) to a portion between each neighboring two power supply parts (P and D) on the route of the resistance heating element 2 among the plurality of parts. That is, the additional driving part 52 individually supplies additional power to the plurality of divided regions Rn.

Accordingly, in the resistance heating element 2, the additional current ends up partially flowing so as to be superimposed on the main current flowing in the entirety thereof. As a result, for example, the majority of the amount of heat generated by the heater body 10a is realized by the main power while temperature control suitable for the area Ar can be carried out for each area Ar of the heater body 10a. Consequently, for example, homogenization of the temperature distribution in the heater body 10a and conversely formation of a desired temperature gradient in the heater body 10a are facilitated. Note that, in the following description, basically the explanation will be given taking as an example a case where the temperature distribution is made uniform.

The main power may be either of DC power or AC power. Also, the additional power may be either of DC power or AC power. Whether the power is DC or AC power may be the same between the main power and the additional power or may be different. Further, it may be also the same or different among the plurality of divided regions Rn. The frequency of the AC power may be the same or different between the main power and the additional power as well. In the case where it is different, either of the frequency of the main power or the frequency of the additional power may be higher as well. The frequency of the AC power of the additional power may be the same or different among the plurality of divided regions Rn. The specific value of the frequency of the AC power may be suitably set. The AC power may be one in which potentials at the two ends of the region supplied with power fluctuate, may be one in which one end is made the reference potential and the potential only at the other end fluctuate. The fluctuation of the potential may switch it to positive or negative relative to the reference potential or may not switch it.

For example, the main power is DC power. Further, the additional power is AC power. Alternatively, the main power is AC power, and the additional power is AC power having a higher frequency than the main power. Note that, in the explanation of the present non-limiting embodiment, as the specific configuration of the drive device 50, one predicated on such relationships will be exemplified. Even in the relationships of the main power and the additional power described above, specific values of the frequencies of the AC power as the main power and the AC power of the additional power may be suitably set. For example, the frequency of the main power is 10 Hz to 100 Hz. Further, the frequency of the main power may be the frequency of the commercial power source as it is. For example, in Japan, it is 50 Hz or 60 Hz. Further, for example, the frequency of the additional power is 1 kHz to 100 kHz or 1 kHz to 10 kHz.

The relationship of magnitude of the power values may be suitably set between the main power and the additional power. For example, the power values of the two may be different to an extent where the relationship of one being larger than the other is maintained irrespective of fluctuation of the power value for the temperature control. Alternatively, the relationship of magnitude of the two may fluctuate corresponding to the fluctuation described before. For example, the drive device 50 controls the main power and the additional power so that the power value becomes larger in the main power than that in the additional power irrespective of the fluctuation of the power values for the temperature control.

Figure 6B:
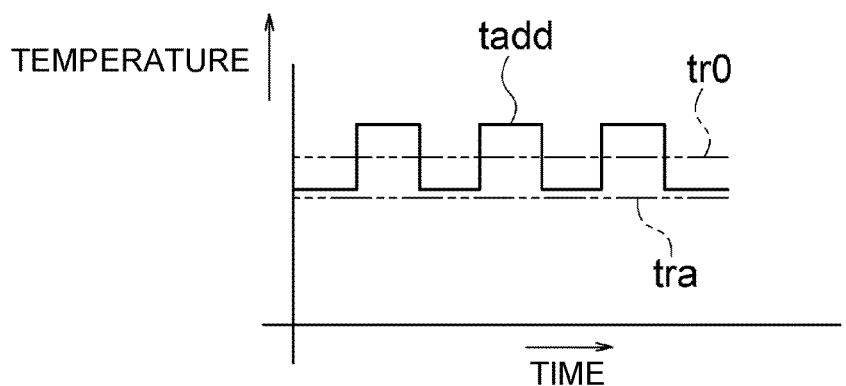
FIG. 6B is a view substantially showing an example of temperature control according to the control system in FIG. 6A.

FIG. 6B is a graph substantially showing an example of the temperature control in the heater system 100. In this graph, an abscissa indicates the time, and an ordinate indicates the temperature.

In the example shown, the drive device 50 for example controls the main power and additional power so that the temperature distribution in the heater body 10a becomes uniform and the temperature thereof converges to a constant target temperature tr0 along with the elapse of time. Specifically, for example, the drive device 50 controls the main power so that the temperature of the heater body 10a becomes a set temperature tra which is lower than the target temperature tr0 by heating by the main power. Note that, FIG. 6B is a schematic graph. Here, the set temperature tra may be grasped as the target value or may be grasped as the result of control. Further, the drive device 50 controls the additional power for each divided region Rn so that the temperature of each divided region Rn (area Ar) becomes the target temperature tr0. Due to this, the temperature of each divided region Rn rises from the set temperature tra by the amount of temperature rise, tadd, caused by heating by the additional power. As a result, the temperature of each divided region Rn converges to the target temperature tr0.

Note that, FIG. 6B is a schematic graph, therefore the state of vibration of the temperature obtained by adding the temperature tr0 and the amount of temperature rise tadd relative to the target temperature tr0 is expressed relatively large by a rectangular wave. In actuality, such vibration may be reduced by employing a precise control method such as PID (proportional integral differential) control.

As understood also from the already given explanation that the relationship of magnitude of the main power and the additional power may be suitably set, the magnitude of the set temperature tra (target value) concerning the heating by the main power may be suitably set relative to the target temperature tr0. For example, the set temperature tra (° C.) may be determined so that the amount of rise from the reference temperature is 50% or more or less than 50% of the amount of rise from the reference temperature up to the target temperature tr0 (° C.). For example, the set temperature tra (° C.) is determined so that the amount of rise from normal temperature (for example, determined as 20° which is the center value of the normal temperature 20° C.±15° C. defined by the Japanese Industrial Standards) is 90% or more of the amount of rise from the normal temperature to the target temperature tr0. Further, for example, in a case where it is intended to achieve the target temperature tr0 by only the main power, the temperature difference which may be generated in the heater body 10a or heated object is found according to experiments or computation. A value is obtained by multiplying the above difference by a predetermined coefficient (for example 1 or more and 3 or less). The value is subtracted from the target temperature tr0. The result may be found as the set temperature tra. As an example, the target temperature tr0 is 650° C., and the set temperature tra is 620° C.

(Isolation Transformer)

Returning to FIG. 6A, the drive device 50 for example has a first isolation transformer T1 to fourth isolation transformer T4 (below, sometimes they will be simply referred to as the "isolation transformers T" and will not be differentiated). An isolation transformer T is for example provided for each divided region Rn and mediates the supply of the AC power of the additional power from the additional driving part 52 to the divided region Rn. By the provision of such isolation transformers T, for example, when a component of a frequency higher than the frequency of the AC power (noise) is included in the additional power, an liability of flow of the component to the resistance heating element 2 can be reduced. This is because the impedance (reactance) of the coil becomes larger as the frequency is higher.

In an isolation transformer T, the primary side (coil) and the secondary side (coil) only have to be insulated. Naturally, an isolation transformer T may be configured so that not only the primary side and the secondary side are simply insulated, but also a shield is arranged or the like so that isolation between the primary side and the secondary side is improved (may be an isolation transformer in a narrow sense as well). The structure and material etc. of the isolation transformers T may be the same as various known ones.

In an isolation transformer T, the transformation ratio cannot be changed. The transformation ratio is constant. Otherwise, the transformation ratio can be changed in the isolation transformer T, but the drive device 50 does not change the transformation ratio of the isolation transformer T concerning the control (fluctuation) of the voltage of the additional power so as to make the temperature of the heater body 10a follow the target temperature. That is, the transformation ratio of the isolation transformer T is constant regardless of the temperature of the ceramic heater 10. However, even if it is constant regardless of the temperature, naturally fluctuation of deviation accompanying the temperature change arises.

The transformation ratio of the isolation transformer T may be less than 1, may be 1, or may exceed 1. Other parameters may be suitably set as well. For example, the inductance of the coil in the isolation transformer T may be suitably set so that the impedance is relatively small at the frequency of the AC power of the additional power, and the impedance becomes relatively higher at the frequency of high frequency component which should be cut.

(Coil)

The drive device 50 for example has a first capacitor C1 to a fourth capacitor C4 (below, sometimes they will be simply referred to as the "capacitors C" and will not be differentiated). A capacitor C is for example provided for each divided region Rn and is connected in series between the additional driving part 52 and the divided region Rn. By the provision of such capacitors C, for example, the liability of flow of a main current of a DC current or an AC current having a relatively lower frequency to the additional driving part 52 side is reduced, while an additional current of an AC current having a relatively high frequency can be made to flow to the resistance heating element 2. This is because the impedance (reactance) of capacitors C is larger as the frequency becomes lower.

The structure and material etc. of the capacitors C may be made the same as various known ones. The capacitance of the capacitors C may be suitably set so that the impedance becomes relatively high at the frequency of the DC power or AC power as the main power and the impedance becomes relatively low at the frequency of the AC power of the additional power.

(Specific Configuration of Drive Device)

FIG. 7 is an example of a functional block diagram for controlling the temperature in the heater system 100.

The heater system 100, as already explained, has the ceramic heater 10 and drive device 50. The drive device 50 is provided with a main control part 101 which controls the supply of the main power, an additional control part 110 which controls the supply of the additional power, and a temperature measurement part 130 and a temperature measurement control part 150 which measure the temperature of the heater body 10a.

Note that, the main driving part 51 explained with reference to FIG. 6A is for example configured by the main control part 101, temperature measurement part 130, and temperature measurement control part 150. Further, the additional driving part 52 explained with reference to FIG. 6A is for example configured by the additional control part 110, temperature measurement part 130, and temperature measurement control part 150. The temperature measurement part 130 and temperature measurement control part 150 are shared by the main driving part 51 and the additional driving part 52.

(Main Control Part)

The main control part 101, for example, converts the power supplied from a commercial power source or not shown power supply circuit to DC power or AC power having a suitable voltage and supplies the power as the main power through the terminals 5 to the pair of main power supply parts P. At this time, the main control part 101, as explained with reference to FIG. 6B, controls the voltage of the main power so that the set temperature tra is realized by the main power.

The set temperature tra is for example set by operation by a user with respect to a not shown input device. Otherwise, the target temperature tr0 may be set by operation by the user with respect to the input device, and the predetermined computation processing with respect to this target temperature tr0 may be carried out by the drive device 50 (for example the main control part 101 or temperature measurement control part 150) to set the set temperature tra as well. The input device may be the same as various known ones. For example, it may be a switch outputting a signal corresponding to the rotation position of a knob or may be a touch panel.

Note that the signal including information of the set temperature tra or target temperature tr0 which is output by the input device to the main control part 101 is for example a signal taking the voltage value as the signal level (the voltage value is different in accordance with the content of the information). Also the other various signals which will be explained later may be signals taking the voltage values as the signal levels so far as it is not particularly indicated otherwise.

The control carried out by the main control part 101 is for example feedback control based on the actual temperature (detection temperature) of the heater body 10a. However, unlike the example shown, the control carried out by the main control part 101 may be open control without performing feedback as well. As explained with reference to FIG. 6A and FIG. 6B, this is because the temperature of each divided region Rn (each area Ar) is controlled also by the control of the additional power.

The method of feedback control carried out by the main control part 101 may be a known suitable one. For example, the control may be proportional control, may be PD (proportional differential) control, may be PI (proportional integral) control, or may be PID control. Further, for example, the control may be on/off control stopping the supply of power when the detection temperature reaches a set temperature (or another temperature or temperature range based on a set temperature) and supplying power when it does not reach a set temperature as well. When PID control is employed as the control method, for example, overshoot, steady state deviation, etc. are reduced, so the temperature control can be highly precisely carried out.

Corresponding to the target value of the control by the main control part 101 being not the target temperature tr0 (FIG. 6B), but being a set temperature tra which is lower than this, under the control carried out by the main control part 101, the temperature to be fed back is for example not the actual temperature of the heater body 10a as it is, but is a temperature lower than the actual temperature.

For example, the main control part 101 multiplies a predetermined coefficient (less than 1) with respect to the actual temperature and/or subtracts a predetermined constant from the actual temperature so that the main control part 101 calculates the temperature which should be made to follow the set temperature tra. Further, for example, computation processing using a map linking the actual temperature and the temperature to be followed may be carried out as well. Corresponding to the difference between the actual temperature and the target temperature tr0 or set temperature tra or absolute values of the actual temperature, the target temperature tr0 or set temperature tra, the coefficient or constant or computation method may be different as well. When the drive device 50 performs predetermined computation with respect to the target temperature tr0 and sets the set temperature tra as explained above, the same computation as that computation may be carried out with respect to the actual temperature as well.

The information (signal including the information) of the actual temperature of the heater body 10a is input from the temperature measurement control part 150 to the main control part 101. Note that, the roles of the main control part 101 and the temperature measurement control part 150 may be suitably shared. For example, unlike the above explanation, in place of the actual temperature information, the temperature obtained by applying the above computation with respect to the actual temperature may be input from the temperature measurement control part 150 to the main control part 101, or the computation may be carried out in the temperature measurement control part 150 up to calculation of the voltage value of the main power based on deviation as well.

Concerning the control by the main control part 101, the actual temperature of the heater body 10a is for example a mean temperature of the entire heater body 10a. However, the actual temperature may be the temperature at a specific position in the heater body 10a as well. The specific position may be or not may be a position where the temperature becomes close to the mean temperature of the entire heater body 10a. This is because, in any case, finally the temperature of each divided region Rn is suitably controlled according to the control of the additional power for each divided region Rn.

(Additional Control Part)

The additional control part 110 for example converts the power supplied from a commercial power source or not shown power supply circuit to AC power having a suitable voltage and supplies the power as additional power through the terminals 5 to the plurality of divided regions Rn. At this time, the additional control part 110, as explained with reference to FIG. 6B, controls the additional power for each divided region Rn so that the target temperature tr0 is realized by superimposing the additional power with respect to the main power. Note that, the target temperature tr0, as already referred to, is for example set by operation by the user with respect to a not shown input device.

The control carried out by the additional control part 110 is for example feedback control based on the actual temperature (detection temperature) of the heater body 10a. The method of feedback control carried out by the additional control part 110, in the same way as the main control part 101, may be a known suitable one. For example, it is proportion control, PD control, PI control, PID control, or on/off control. Note that, when PID control is employed as the control method, for example, overshoot, state deviation, etc. are reduced, so the temperature control can be highly precisely carried out.

The temperature fed back in the control carried out by the additional control part 110 may be for example the actual temperature as it is unlike the main control part 101. Further, the additional control part 110 performs control so that the actual temperature becomes the target temperature tr0. As a result, the difference between the target temperature tr0 and the temperature fed back in the control by the main control part 101 (the temperature lower than the actual temperature) is realized by the additional power.

The information (signal including the information) of the actual temperature of the heater body 10a is input from the temperature measurement control part 150 to the additional control part 110. Concerning the control by the additional control part 110, the actual temperature of the heater body 10a is for example the temperature of each divided region Rn.

Note that, the roles of the additional control part 110 and the temperature measurement control part 150 may be suitably shared. For example, unlike the above explanation, in place of the information of the actual temperature, the deviation between the target temperature tr0 and the actual temperature may be input from the temperature measurement control part 150 to the additional control part 110, or the computation may be carried out in the temperature measurement control part 150 up to the calculation of the voltage value of the additional power based on the deviation.

The additional control part 110, for example, may perform the control in a cycle (the cycle in which change or maintaining of the amount of operation is determined) shorter than the cycle of the control in the main control part 101. In this case, for example, the additional control part 110 can smoothly cope with a temperature change occurring due to the control by the main control part 101, therefore the actual temperature becomes easier to be made to converge to the target temperature tr0.

The additional control part 110, for example, has a common power supply device 102 commonly provided with respect to the plurality of divided regions Rn, and branched control parts 111 to 114 and power amplifiers 121 to 124 provided for each divided region Rn and supplying power from the common power supply device 102 to the divided regions Rn.

The branched control part 111 and power amplifier 121 are used for the first divided region R1. The branched control part 112 and power amplifier 122 are used for the second divided region R2. The branched control part 113 and power amplifier 123 are used for the third divided region R3. The branched control part 114 and power amplifier 124 are used for the fourth divided region R4.

The common power supply device 102 converts the power supplied from a commercial power source or not shown power supply circuit to AC power having a frequency determined in advance. The frequency of this AC power is for example the same as the frequency of the AC power of the additional power supplied to the plurality of divided regions Rn. In this way, by sharing the common power supply device 102 among the plurality of divided regions Rn, for example, the configuration of the additional control part 110 is reduced in size.

The configurations of the branched control parts 111 to 114 may be the same as each other. Further, the configurations of the power amplifiers 121 to 124 may be the same as each other. In the following description, as the representatives of them, the branched control part 111 and power amplifier 121 used for to the first divided region R1 will be explained.

The branched control part 111 and the power amplifier 121 control the voltage of the AC power of the additional power supplied to the first isolation transformer T1 so that the actual temperature of the first divided region R1 input from the temperature measurement control part 150 follows the target temperature tr0.

More specifically, for example, the branched control part 111 outputs the signal of a signal level corresponding to the deviation between the target temperature tr0 and the actual temperature of the first divided region R1 input from the temperature measurement control part 150. As already explained, in the determination of the signal level based on the deviation, suitable control such as PID control may be carried out. The power amplifier 121 for example amplifies the power of the signal from the branched control part 111 with a constant amplification ratio and outputs the result to the first isolation transformer T1. From another viewpoint, at the supply of the AC power from the common power supply device 102 through the power amplifier 121 to the resistance heating element 2, the power value thereof is controlled by the branched control part 111.

To each of the branched control part 111 and the power amplifier 121, for example, as already explained, AC power having the same frequency as that of the additional power is supplied from the common power supply device 102. However, the additional power which is finally supplied to the first isolation transformer T1 only have to be AC power. A DC signal may be suitably used in that process.

The branched control part 111 may perform compensation processing with respect to a change of resistivity accompanying a temperature change as well. For example, the gain at the time of determination of the signal level (voltage value of the additional power) based on the deviation may be adjusted based on the temperature change as well. Due to this, higher precision temperature control becomes possible.

(Temperature Measurement Part)

As already referred to, in the heater system 100, the resistance heating element 2 is used also for an element (thermistor) for detecting the temperature. That is, the temperature measurement part 130 outputs a signal of a signal level corresponding to the change of the resistivity of the resistance heating element 2. Due to this, it becomes possible to specify the temperature of the heater body 10$a$ (strictly speaking, the resistance heating element 2).

The change of the resistivity may be detected in a suitable region on the route of the resistance heating element 2. In the example shown, the supply parts (P and D) for supplying power to the resistance heating element 2 are used also for the portions for detecting the change of the resistivity (detecting the voltage) of the resistance heating element 2. Due to this, it becomes possible to detect the mean temperature in the entirety of the resistance heating element 2 (between the pair of main power supply parts P) and the temperature in each divided region Rn (between the neighboring power supply parts (P or D) of the resistance heating element 2). Note that, the portion for detecting the potential may be set separately from the power supply part as well.

Specifically, for example, the temperature measurement part 130 is provided with resistor elements R0, R5, R7, R9, and R12, LPFs (low-pass filters) 131 to 135 and measurement-use amplifiers 141 to 145.

The resistor element R0, as will be explained in detail later, is provided for specifying the current flowing in the resistance heating element 2 according to the main power and is connected in series between the main control part 101 and the resistance heating element 2. The resistance value of the resistor element R0 is for example made smaller in comparison with the resistance value of the resistance heating element 2. For example, the resistance value of the resistor element R0 is $\frac{1}{100}$ or less of the resistance value of the entire resistance heating element 2. By setting the resistance value of the resistor element R0 small in this way, for example, the drop of the current in the resistance heating element 2 which occurs due to the provision of the resistor element R0 is reduced. That is, the influence of the temperature measurement exerted upon the heating by the resistance heating element 2 is made smaller.

Note that, in FIG. 7, for convenience, the notation of the second main power supply part Pb (here, grounded) is shown not in the ceramic heater 10, but in the temperature measurement part 130. This shows that the resistor element R0 is connected in series between the main control part 101 and the resistance heating element 2. In actuality, the second main power supply part Pb is positioned in the ceramic heater 10, and the resistor element R0 is positioned outside of the ceramic heater 10. However, it is also possible to provide the resistor element R0 in the ceramic heater 10 (between the pair of main power supply parts P).

The following explanation of the temperature measurement by the temperature measurement part 130 and temperature measurement control part 150 will be given assuming that the resistor element R0 is positioned between the first branched power supply part D1 and the second main power supply part Pb for convenience.

The temperature coefficient (ratio of change of the resistivity with respect to the temperature change) of the resistor element R0 may be equal to or different from the resistance heating element 2. Note that, in a case where a portion of the resistance heating element 2 is configured as the resistor element R0, naturally the temperature coefficients of the two are equal.

The resistor elements R5, R7, R9, and R12 are for voltage division. Further, there is no problem even if they are grasped as portions of the LPFs 131 to 134. The resistance values of the resistor elements R5, R7, R9, and R12, and LPFs 131 to 134 etc. are set larger in comparison with the resistance value of the resistance heating element 2. For example, the resistance value of each of the resistor elements R5, R7, R9, and R12 is not less than 1000 times the resistance value of the entire resistance heating element 2. By setting the resistance values in this way, for example, the voltage drop of the resistance heating element 2 occurring due to the connection of the temperature measurement part 130 to the resistance heating element 2 is reduced. That is, the influence of the temperature measurement exerted upon the heating by the resistance heating element 2 is made smaller.

The LPFs 131 to 135 remove the high frequency component (noise component) from the voltage signal from the resistance heating element 2. The configuration thereof may be made the same as those of various known ones. For example, the LPFs 131 to 135 are configured including capacitors having single electrodes connected between the resistance heating element 2 and the measurement-use amplifiers 141 to 145 and having the other electrodes grounded. The passbands of the LPFs 131 to 135 may be suitably set so as to permit passing of signals having frequencies not more than the frequency of the additional power (the power having a relatively higher frequency between the main power and the additional power).

The measurement-use amplifiers 141 to 145 amplify the voltage signals output from the LPFs 131 to 135 and output the results to the temperature measurement control part 150. The configurations thereof may be made the same as those of the various known ones. The measurement-use amplifiers 141 to 145 may be suitably supplied with DC power or AC power from a not shown power supply circuit or the like.

The measurement-use amplifier 141 and the LPF 131 are connected to the first branched power supply part D1 and the second main power supply part Pb and detect a voltage V1 between these two power supply parts (voltage in R0 and R1). The measurement-use amplifier 142 and the LPF 132 are connected to the second branched power supply part D2 and the second main power supply part Pb and detect a voltage V2 between these two power supply parts (voltage in R0 to R2). The measurement-use amplifier 143 and the LPF 133 are connected to the third branched power supply part D3 and the second main power supply part Pb and detect a voltage V3 between these two power supply parts (voltage in R0 to R3). The measurement-use amplifier 144 and the LPF 134 are connected to the first main power supply part Pa and the second main power supply part Pb and 145 and detect a voltage V4 between these two power supply parts (voltage in R0 to R4). The measurement-use amplifier 145 and the LPF 135 are connected between the resistor element R0 and the first divided region R1 and are connected to the second main power supply part Pb and detect a voltage Ki in the resistor element R0.

The information (signals including the information) of the detected voltages Ki and V1 to V4 is input to the temperature measurement control part 150.

(Temperature Measurement Control Part)

The temperature measurement control part 150, based on the information of the voltages Ki and V1 to V4 input from the temperature measurement part 130, identifies the mean temperature of the entire resistance heating element 2 and the temperature in each of the plurality of divided regions Rn. Further, the temperature measurement control part 150 inputs the information of the mean temperature (temperature t0 which will be explained later) of the entire resistance heating element 2 to the main control part 101 and inputs the temperatures (temperatures t1 to t4 which will be explained later) of the plurality of divided regions Rn to the additional control part 110 (branched control parts 111 to 114).

The temperature measurement control part 150 for example performs the following computation and specifies the temperature of the resistance heating element 2 based on the information of the voltages Ki and V1 to V4.

The resistance value of the resistor element R0 is defined as r0 [Ω]. At this time, the current I flowing in the resistor element R0 is represented by the following equation:

$$I = Ki/r0 \quad (1)$$

Here, the resistor element R0 is connected in series with respect to the resistance heating element 2, therefore the current I can be grasped as the current which flows through the entire resistance heating element 2 according to the main power supplied by the main control part 101. Note that, in the above equation, the influence of r0 of the temperature change is regarded as a relatively small one and is ignored.

It is assumed that the resistance values at the predetermined reference temperature of the resistor elements R0 and the first divided region R1 to the fourth divided region R4 are r0 to r4 [Ω], the temperature coefficient of the resistor element R0 and the resistance heating element 2 is α [1/° C.], and the mean temperature of the entire resistance heating element 2 is to. Here, for simplification of the explanation, the temperature change of the temperature coefficient α is not considered. Further, it is assumed that the reference temperature described above (the temperature at the time when the resistance values of R0 to R4 are r0 to r4) is 0 [° C.]. Note that, the temperature coefficient α is for example 0.004. At this time, the voltage V4 in R0 to R4 considering the influence of the temperature is represented by the following equation:

$$V4 = I \cdot (r0 + r1 + r2 + r3 + r4) \cdot (1 + \alpha \cdot t0) \quad (2)$$
$$= (Ki/r0) \cdot (r0 + r1 + r2 + r3 + r4) \cdot (1 + \alpha \cdot t0)$$

From the above Equation (2), the following equation is derived:

$$t0 = ((V4/((Ki/r0) \cdot (r0+r1+r2+r3+r4))) - 1)/\alpha \quad (3)$$

Accordingly, the temperature measurement control part 150 can calculate the mean temperature t0 of the entire resistance heating element 2 by entering the values of r0 to r4 and α which are held in advance and the voltages Ki and V4 input from the temperature measurement part 130 into Equation (3).

Under the same assumption as (2) described above, if the temperature of the first divided region R1 is t1, the voltage V1 in R0 and R1 considering the influence of the temperature is represented by the following equation:

$$V1 = I \cdot (r0 + r1) \cdot (1 + \alpha \cdot t1) \quad (4)$$
$$= (Ki/r0) \cdot (r0 + r1) \cdot (1 + \alpha \cdot t1)$$

From Equation (4) described above, the following equation is derived:

$$t1 = ((V1/((Ki/r0) \cdot r0+r1))) - 1)/\alpha \quad (5)$$

Accordingly, the temperature measurement control part 150 can calculate the temperature t1 of the first divided region R1 by entering the values of r0, r1, and α which are held in advance and the voltages Ki and V1 input from the temperature measurement part 130 into Equation (5).

In the second divided region R2 to the fourth divided region R4 as well, in the same way as the first divided region R1, the current I according to the main power flows, and the voltages in the divided regions are determined according to the current I and the resistance values r2 to r4. Accordingly, Equation (5) can be utilized as the equation for specifying the temperatures t2 to t4 in the second divided regions R2 to the fourth divided region R4.

Specifically, the voltage of the second divided region R2 is V2−V1. Therefore, in Equation (5), by replacing "V1" with "V2−V1" and replacing "r1" with "r2", an equation for calculating the temperature t2 of the second divided region R2 is obtained. The voltage of the third divided region R3 is V3−V2. Therefore, in Equation (5), by replacing "V1" with "V3−V2" and replacing "r1" with "r3", an equation for calculating the temperature t3 of the third divided region R3 is obtained. The voltage of the fourth divided region R4 is V4−V3. Therefore, in Equation (5), by replacing "V1" with "V4−V3" and replacing "r1" with "r4", an equation for calculating the temperature t4 of the fourth divided region R4 is obtained.

Note that, in the above description, for simplification of the explanation, the temperature change of the temperature coefficient α was ignored and the reference temperature was determined to 0° C. Further, they may be considered as well. Further, in the above explanation, concerning the resistor element R0, the temperature change thereof was ignored, the temperature thereof was regarded to be equal to the temperature of the resistance heating element 2, the voltage in the resistor element R0 was suitably ignored, and the found temperature was regarded as the temperature of the entire resistance heating element 2 or of each divided region Rn. This is because the resistance value of the resistor element R0 is extremely small in comparison with the resistance value of the resistance heating element 2 as already explained. However, the influence of the resistor element R0 may be added as well. For example, a suitable correction coefficient may be multiplied or a positive or negative correction constant may be added as well.

(Method of Manufacturing Ceramic Heater)

The method of manufacturing the ceramic heater 10 is for example as follows.

First, ceramic green sheets which become the first ceramic layer 1a to third ceramic layer 1c are prepared. The green sheets for example may be formed by forming a slurry in a sheet shape by a doctor blade method or may be formed by spraying a slurry according to a spray drying method to form granules and utilizing a roll compaction method. The green sheets are formed to substantially constant thicknesses. The slurry is for example prepared by preparing raw materials of the principal ingredients so that aluminum oxide, aluminum nitride, silicon nitride, or silicon carbide becomes the principal ingredient, adding predetermined amounts of a sintering assistant, binder, solvent, dispersant, or the like to them and then mixing.

Next, the green sheets are processed by laser and/or punched using a die so as to obtain a desired shape. At this time, for example, holes in which the connection conductors 3 and terminals 5 are arranged are formed.

Next, a metal paste which becomes the resistance heating element 2, connection conductors 3, wirings 4, terminals 5, and other conductors is arranged on the green sheets by screen printing or another suitable method. For example, the upper surface of the green sheet which becomes the second ceramic layer 1b (may be the lower surface of the green sheet which becomes the first ceramic layer 1a as well) is covered by a metal paste which becomes the resistance heating element 2. The upper surface of the green sheet which becomes the third ceramic layer 1c (may be the lower surface of the green sheet which becomes the second ceramic layer 1b as well) is covered by a metal paste which becomes the wirings 4. A metal paste which becomes the connection conductors 3 is filled in the holes formed in the green sheet which becomes the second ceramic layer 1b. A metal paste which becomes the terminals 5 is filled in the holes formed in the green sheet which becomes the third ceramic layer 1c.

Next, the green sheets are stacked to prepare a layered body of the green sheets. Note that, as the bonding material used when stacking the sheets, use may be made of the slurry explained above.

Further, the layered body of green sheets is sintered matching with the sintering conditions of the principal ingredients. Due to this, a sintered body (ceramic substrate 1) provided with the resistance heating element 2, connection conductors 3, wirings 4, and terminals 5 in the internal portion can be obtained.

Note that, it is also possible to prepare a plasma treatment-use table or electrostatic chuck by sandwiching a metallic paste, metal plate, or metal mesh which becomes the plasma treatment-use electrode or electrostatic chuck-use electrode other than the resistance heating element 2, connection conductors 3, wirings 4, and terminals 5 at the time of stacking.

As described above, in the present non-limiting embodiment, the heater system 100 has the ceramic heater 10 and the drive device 50. The ceramic heater 10 has the ceramic substrate 1 and the resistance heating element 2. The ceramic substrate 1 has the upper surface 10c. The resistance heating element 2 extends in the internal portion or on the surface of the ceramic substrate 1 (internal portion in the present non-limiting embodiment) along the upper surface 10c. The drive device 50 has the main driving part 51 which supplies the main power to the entirety of the resistance heating element 2 and the additional driving part 52 which supplies additional power to a portion of the resistance heating element 2 constituted by the divided region Rn by superimposing it on the main power.

Accordingly, for example, main heating can be carried out according to the main power, while the temperature control of the divided region Rn can be carried out corresponding to the individual circumstance of the divided region Rn. As a result, for example, the temperature of the heater body 10a can be made uniform by raising the temperature of the divided region Rn in which the temperature is hard to rise. Conversely, it is also possible to realize a desired temperature gradient. Further, for example, the necessity of providing the power supply circuit for supplying a large power for each divided region Rn can be reduced in comparison with such an aspect of individually supplying power with respect to the plurality of divided regions Rn without using the main power. As a result, for example, reduction of size or reduction of cost is expected.

Further, in the present non-limiting embodiment, the additional driving part 52 supplies the additional power to each of the plurality of divided regions Rn obtained by dividing the resistance heating element 2 into a plurality of regions and individually controls the additional power to the plurality of divided regions Rn.

Accordingly, for example, the main heating is carried out according to the main power while the temperature control in accordance with the individual circumstances explained above can be carried out over the entire resistance heating element 2. As a result, for example, homogenization of the temperature or realization of the desired temperature gradient is further facilitated. Further, for example, unlike the present non-limiting embodiment, in a case where a plurality of resistance heating elements are provided with respect to one ceramic substrate and the power is individually supplied to the plurality of resistance heating elements, the power must be supplied to the two ends of each resistance heating element, therefore the number of the power supply parts becomes twice the number of the resistance heating elements. In the present non-limiting embodiment, however, the number of the power supply parts may be n+1 where the number of the plurality of divided regions Rn is n (>2). That is, the number of power supply parts can be decreased.

Further, in the present non-limiting embodiment, the main power is the DC power and the additional power is the AC power, or the main power is the AC power and the additional power is the AC power having a higher frequency than the main power.

In this case, for example, the main power and the additional power do not have the same frequency, therefore liability of synchronization of the two is reduced and consequently superimposition of the powers is reliably achieved. Further, in comparison with an aspect where the frequency of the main power is relatively higher (this aspect is included in the art according to the present disclosure), the liability of generation of high-frequency noise by the main power is reduced. As a result, for example, it becomes easier to utilize the ceramic heater 10 in a system using a high-frequency voltage such as a plasma treatment system or becomes easier to use a larger power than the additional power as the main power. Further, the DC power is lower in instantaneous voltage in comparison with the AC power of an equivalent effective voltage. By using such DC power as the main power for performing main heating, the service life of the ceramic heater 10 as a whole becomes longer.

Further, in the present non-limiting embodiment, the drive device 50 has the capacitor C which is connected in series between the additional driving part 52 and the divided region Rn.

Accordingly, for example, as already explained, the liability of the main current of the DC current or the AC current having a relatively lower frequency ending up flowing to the additional driving part 52 side is reduced, while the additional current of the AC current having a relatively higher frequency can be made flow to the resistance heating element 2. As a result, for example, useless consumption of power can be reduced, so the running costs can be reduced.

Further, in the present non-limiting embodiment, the additional driving part 52 supplies additional power while controlling the voltage of the AC power of the additional power corresponding to the temperature of the ceramic heater 10. The drive device 50 further has the isolation transformer T which transfers the additional power supplied from the additional driving part 52 to the divided region Rn with the constant transformation ratio regardless of the temperature of the ceramic heater 10.

Accordingly, for example, as already explained, where a component (noise) having a frequency higher than the frequency of the AC power is included in the additional power, the liability of flow of the component to the resistance heating element 2 can be reduced. As a result, for example utilization of the ceramic heater 10 in a system using a high-frequency voltage such as a plasma treatment system is facilitated.

Further, in the present non-limiting embodiment, the main driving part 51 controls the main power based on the change of the resistance value of the entire resistance heating element 2.

That is, the resistance heating element 2 is used also for temperature detection. Accordingly, for example, it becomes unnecessary to provide the temperature sensor separately from the resistance heating element 2, therefore the configuration of the ceramic heater 10 can be simplified and reduced in size. Further, for example, the pair of main power supply parts P for supplying the power to the resistance heating element 2 can be used also as the portion for detecting the change of the resistance value of the resistance heating element 2. As a result, for example, the configurations concerned with the connection conductors 3, wirings 4, and/or terminals 5 can be simplified and reduced in size. Note that, an aspect providing the temperature sensor separately from the resistance heating element 2 is included in the art according to the present disclosure.

Further, in the present non-limiting embodiment, the additional driving part 52 controls the additional power based on the change of the resistance value in the divided region Rn of the resistance heating element 2.

Accordingly, for example, in the same way as the above description, by using the resistance heating element 2 also for temperature detection, it becomes unnecessary to separately provide the temperature sensor. Further, the connection conductors 3, wirings 4, and/or the terminals 5 can also be used for temperature detection. Therefore the configuration of the ceramic heater 10 can be simplified and reduced in size. Note that, an aspect providing the temperature sensor detecting the temperature concerned with each divided region Rn separately from the resistance heating element 2 is included in the art according to the present disclosure.

Further, in the present non-limiting embodiment, at least one (D1 and D3 in the present non-limiting embodiment) among the plurality of power supply parts (P and D) of the two ends of the resistance heating element 2 and the ends of the divided regions Rn are positioned outside of the terminal arrangement region 10d which is a portion on the center side of the ceramic substrate 1 in a planar view of the upper surface 10c. Further, the ceramic heater 10 is provided with the plurality of terminals 5, the connection conductor 3, and the wiring 4. The plurality of terminals 5 are electrically connected to the plurality of power supply parts (P and D), are exposed to the outside of the ceramic substrate 1 to the side opposite to the upper surface 10c, and are positioned in the terminal arrangement region 10d in a planar view of the upper surface 10c. The connection conductors 3 project from the power supply parts (D1 and D3) positioned outside of the terminal arrangement region 10d among the plurality of power supply parts to the side opposite to the upper surface 10c. The wirings 4 extend from the connection conductors 3 to the inside of the terminal arrangement region 10d on the side opposite to the upper surface 10c with respect to the resistance heating element 2 in the internal portion or on the surface of the ceramic substrate 1 (the internal portion in the present non-limiting embodiment) and is connected to any of the plurality of terminals 5.

Accordingly, for example, as already explained, it becomes possible to connect any position (power supply part) of the resistance heating element 2 and a terminal 5 arranged at any position. As a result, for example, when hierarchical wiring as in the present non-limiting embodiment is not provided, in order to position the terminals 5 in the terminal arrangement region 10d, the route of the resistance heating element 2 must be controlled to a suitable one so that the power supply parts are positioned in the terminal arrangement region 10d. In the present non-limiting embodiment, however, such a necessity is reduced. Further, for example, the terminals 5 are positioned in the terminal arrangement region 10d, while the branched power supply parts D can be set at any positions in the resistance heating element 2. As a result, for example, setting of the lengths of the divided regions Rn to suitable lengths is facilitated.

Further, in the present non-limiting embodiment, the wiring 4 extends parallel to the upper surface 10c.

Accordingly, for example, the influence of the current flowing through the wiring 4 exerted upon the resistance heating element 2 easily becomes equivalent between the center side and the outside when viewed on a plane. As a result, for example, liability of local generation of an unintended temperature gradient is reduced.

Further, in the present non-limiting embodiment, the area of the lateral cross-section of the wiring 4 is larger than the area of the lateral cross-section of the resistance heating element 2.

Accordingly, for example, the amount of heat generated in the wiring 4 can be reduced. As a result, for example, wasted consumption of power can be reduced, and control of the temperature of the resistance heating element 2 or upper surface 10c can be highly precisely carried out.

Further, in the present non-limiting embodiment, the connection conductor 3 connecting one power supply part (D1 or D3 in the present non-limiting embodiment) and one wiring 4 include a plurality of divided conductors 3a which are connected in parallel between the one power supply part (D1 or D3) and the one wiring 4 so that they are positioned along the route of the resistance heating element 2.

Accordingly, for example, the liability of short-circuiting between the power supply part and a portion other than the power supply part in the resistance heating element 2 is reduced, while it becomes easier to secure the conduction area between the resistance heating element 2 and the wiring 4. For example, in the aspect of simply making the diameter of the connection conductors 3 larger (this aspect is included in the art according to the present disclosure), the conduction area can be made larger, but there is liability of short-circuiting between the power supply part and a portion other than the power supply part in the resistance heating element 2. However, in the present non-limiting embodiment, such a liability is reduced. Further, from another viewpoint, the conduction area can be secured by using a conventionally known via conductor which is substantially circular-shaped in the direction perpendicular to the penetration direction.

Further, from another viewpoint, in the present non-limiting embodiment, the ceramic heater 10 is provided with the ceramic substrate 1, resistance heating element 2, and "n" ("n" is a natural number of 3 or more) electrodes (for example power supply parts P and D) from first to n-th electrodes which supply the power to the resistance heating element 2. The first electrode and the n-th electrode are electrodes between which the main power is supplied. In the resistance heating element 2, two adjoining electrodes are the electrodes between which additional power is supplied.

Accordingly, for example, the main heating is carried out by the main power, while temperature control corresponding to the individual circumstances of the plurality of divided regions Rn can be carried out. As a result, for example, the temperature of the heater body 10a can be made uniform. Further, for example, the necessity of providing a power supply circuit for supplying a large power for each divided region Rn can be reduced. Further, for example, it is not necessary to provide many electrodes as in the case where a plurality of resistance heating elements are provided.

Note that, in the above non-limiting embodiment, the upper surface 10c is one example of the predetermined surface. The entirety of the resistance heating element 2 is one example of the first region. Each of the plurality of divided regions Rn is one example of a second region. The power supply parts (P and D) are examples of the electrodes. The main power is one example of the first power. The additional power is one example of the second power.

Second Non-Limiting Embodiment (Route of Resistance Heating Element and Positions of Power Supply Parts)

Figure 8A:
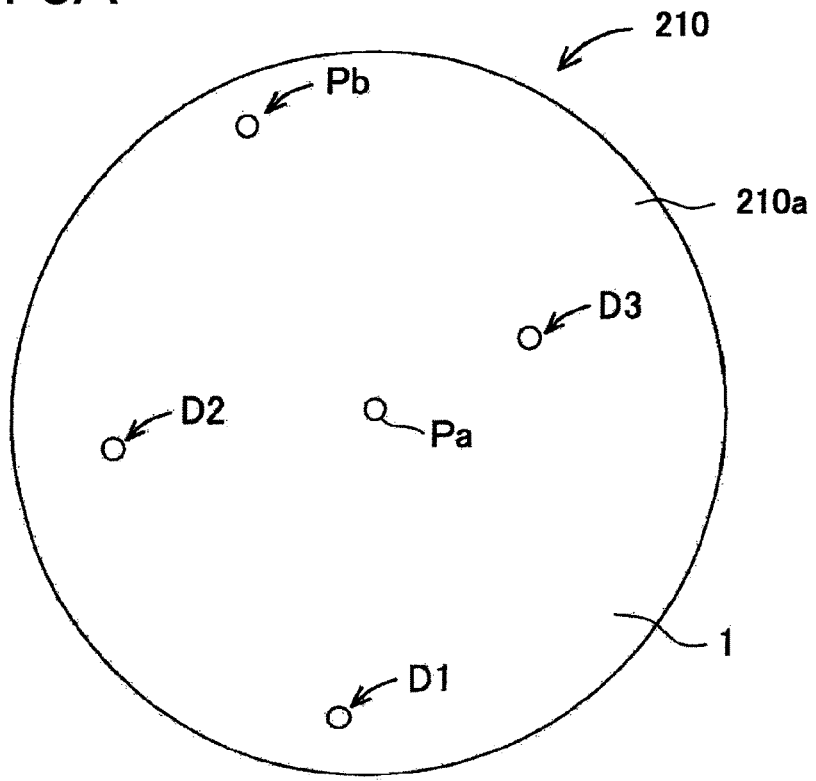
FIG. 8A is a conceptual bottom surface view showing a ceramic heater according to a second a non-limiting embodiment.

FIG. 8A is a bottom surface view showing a heater body 210a of a ceramic heater 210 according to a second non-limiting embodiment or a perspective view seen from the bottom surface side. In this view, outer edges of the heater body 210a and power supply parts (Pa, Pb, and D1 to D3) are shown.

Figure 8B:
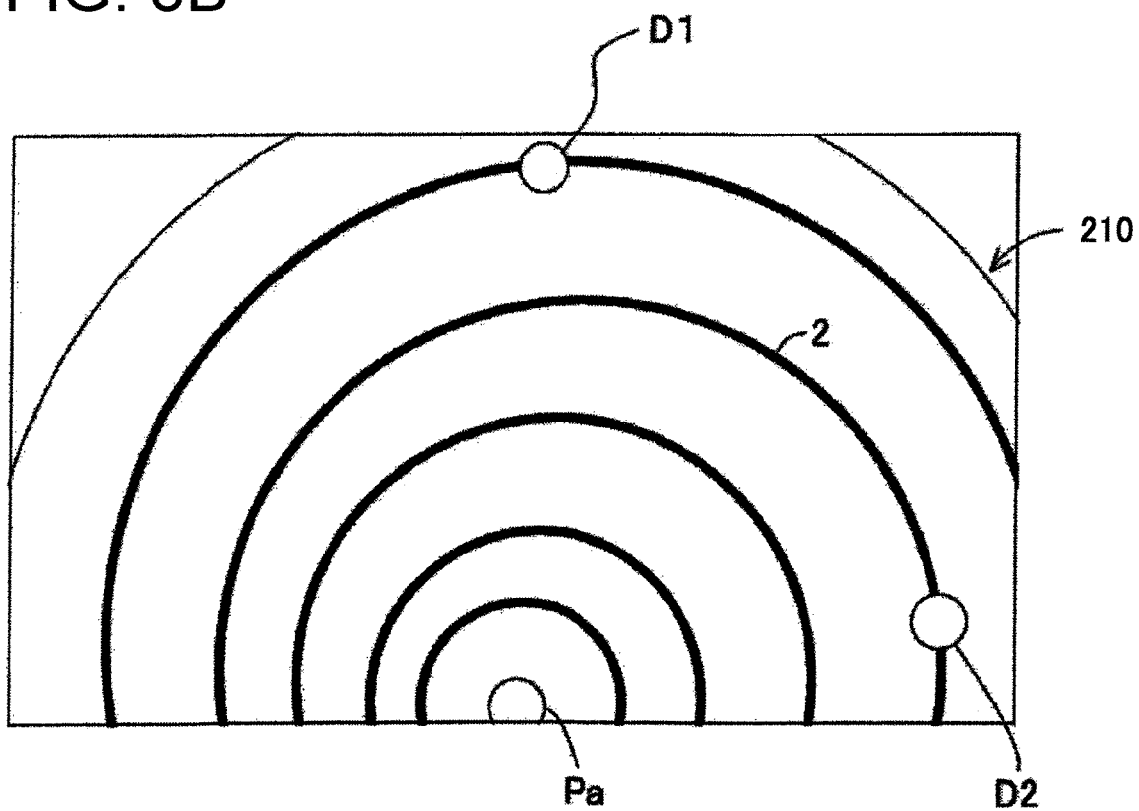
FIG. 8B is a view showing a route of a resistance heating element in the ceramic heater in FIG. 8A.

Further, FIG. 8B is a view showing the route of the resistance heating element 2 in the ceramic heater 210. This view shows the range of a portion in a planar view of the ceramic heater 210. Further, this view corresponds to FIG. 3 of the first non-limiting embodiment concerning the position in the thickness direction of the ceramic heater 210.

The second non-limiting embodiment differs from the first non-limiting embodiment only in the route of the resistance heating element and the positions of the power supply parts (P and D). Further, along with the difference of the positions of the power supply parts, the positions of the connection conductors 3 and wirings 4 etc. are also different from those in the first non-limiting embodiment. The configurations other than these (including the drive device 50) may be the same as the first non-limiting embodiment.

Specifically, in the present non-limiting embodiment, when viewed on a plane, the resistance heating element 2 is given a substantially spiral pattern. That is, the resistance heating element 2 extends so as to circle from the inner circumference to the outer circumference with an offset. Note that, the distance between one circle and the next circle may be equal between the inner circumferential side and the outer circumferential side or may be different. Further, the distance between one circle and the next circle may be constant in the circumferential direction or may change as well. The deviation of the position from the inner circumference to the outer circumference may gradually occur during one circle in each circle or may occur accompanied by steps at a specific position after one circle with a constant radius in each circle.

Note that, the resistance heating element 2 may simply circle as illustrated or may circle while moving back and forth unlike the illustration (so as to meander).

The first power supply part Pa of one end of the resistance heating element 2 is for example positioned at substantially the center of the ceramic substrate 1, and the second main power supply part Pb of the other end of the resistance heating element 2 is for example adjacent to the outer edge of the ceramic substrate 1. The first branched power supply part D1 to the third branched power supply part D3 may be provided at suitable midway positions of the resistance heating element 2. For example, the first branched power supply part D1 to the third branched power supply part D3 may be provided so as to equally divide the resistance heating element 2 (divide it to four equal parts in the example shown). Further, the first branched power supply part D1 to the third branched power supply part D3 for example may be provided non-uniformly by considering a temperature distribution which is apt to be generated in the ceramic heater 10.

(Configuration for Supplying Power)

In the ceramic heater 10, the configuration for supplying power to the power supply parts (P and D) may be suitably determined. For example, in the following way, the same connection conductors 3, wirings 4, and terminals 5 as those in the first non-limiting embodiment may be provided as well.

Figure 9A:
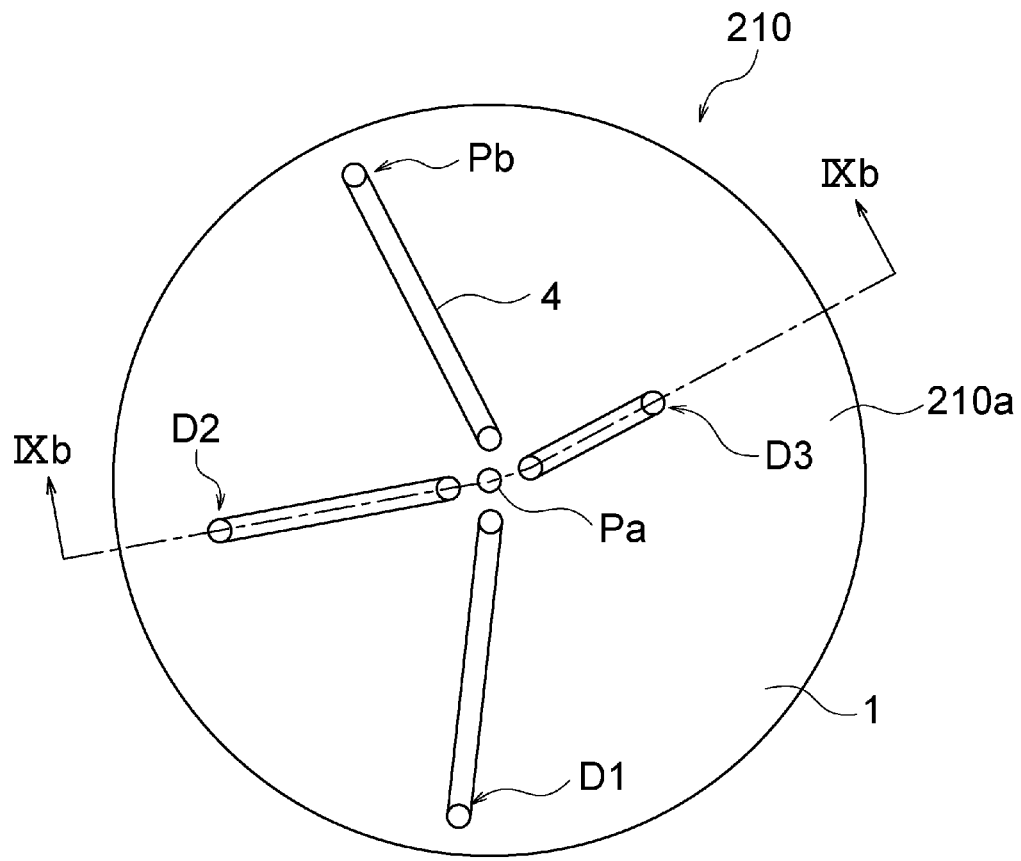
FIG. 9A is a perspective view showing the position of the wiring in FIG. 8A.
Figure 9B:
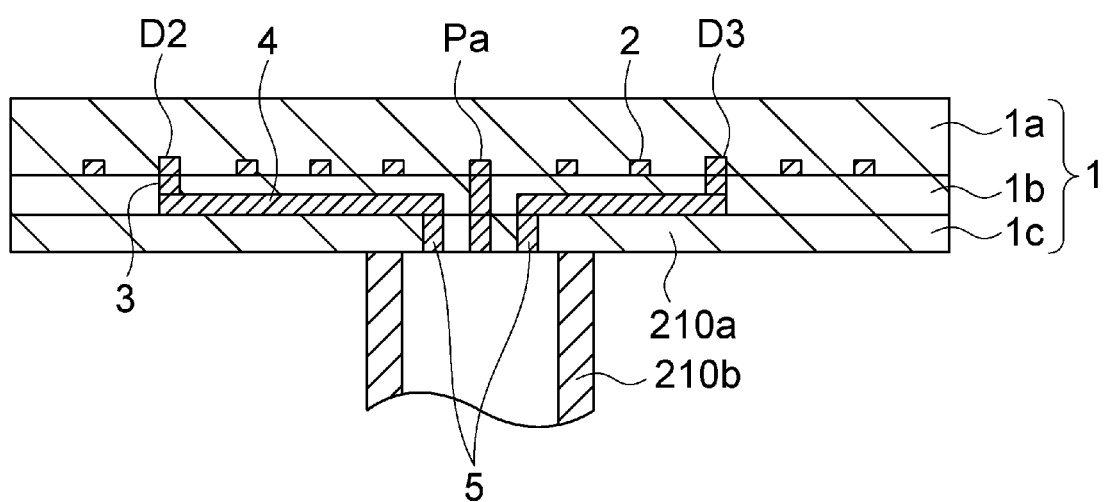
FIG. 9B is a cross-sectional view taken along the IXb-IXb line in FIG. 9A.

FIG. 9A is a perspective view showing the positions of the wirings 4 in FIG. 8A. FIG. 9B is a cross-sectional view taken along the IXb-IXb line in FIG. 9A.

The terminals 5 connected to the plurality of power supply parts (P and D) are positioned in a terminal arrangement region defined by a pipe 210b. On the other hand, among the plurality of power supply parts, the first power supply part Pa is positioned in the terminal arrangement region, but the other power supply parts (Pb, D1 to D3) are positioned outside of the terminal arrangement region.

Further, the power supply parts (Pb, D1 to D3) positioned outside of the terminal arrangement region are connected to the terminals 5 by the connection conductors 3 and wirings 4. The first power supply part Pa positioned in the terminal arrangement region is directly connected to the terminal 5. Note that, in the same way as the first non-limiting embodiment, the connection conductors 3 may be configured by a plurality of divided conductors 3a (FIG. 5), and the first power supply part Pa which was directly connected to the terminal 5 may be connected to the terminal 5 by the connection conductor 3 etc.

In the above non-limiting embodiment as well, the heater system has the main driving part 51 which supplies the main power to the resistance heating element 2 and the additional driving part 52 which supplies additional power to the divided region Rn which is a portion of the resistance heating element 2 by superimposing it on the main power. Further, from another viewpoint, the ceramic heater 10 is provided with the ceramic substrate 1, resistance heating element 2, and "n" ("n" is a natural number of 3 or more) electrodes (for example power supply parts P and D) from first to n-th electrodes which supply power to the resistance heating element 2. The first electrode and the n-th electrode are the electrodes between which the main power is supplied. In the resistance heating element 2, two adjoining electrodes are electrodes between which the additional power is supplied.

Accordingly, the same effects as those by the first non-limiting embodiment are exhibited. For example, the main heating can be carried out by the main power, while temperature control corresponding to the individual circumstances of the plurality of divided regions Rn can be carried out.

<Other Aspects of the Disclosure>

Figure 10A:
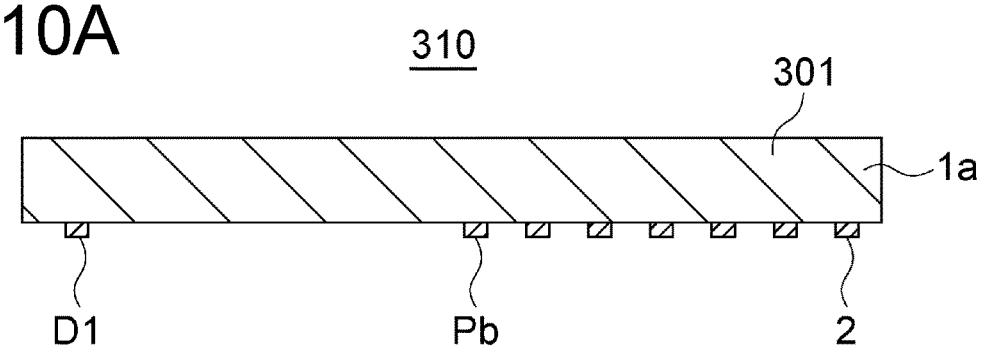
FIG. 10A is a schematic view showing a non-limiting aspect of the disclosure.
Figure 10B:
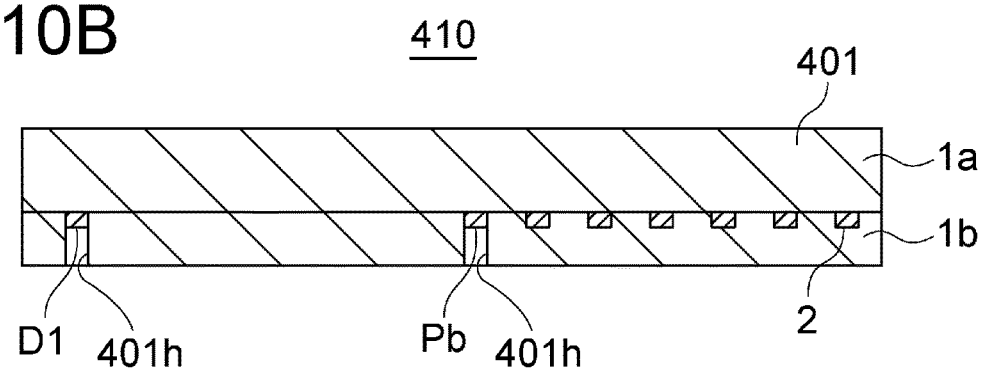
FIG. 10B is a schematic view showing another non-limiting aspect of the disclosure.
Figure 10C:
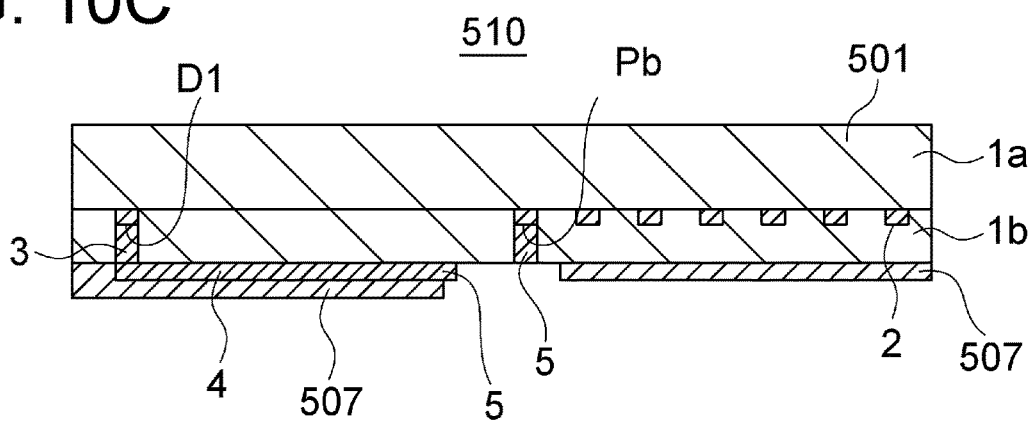
FIG. 10C is a schematic view showing still another non-limiting aspect of the disclosure.
Figure 10D:
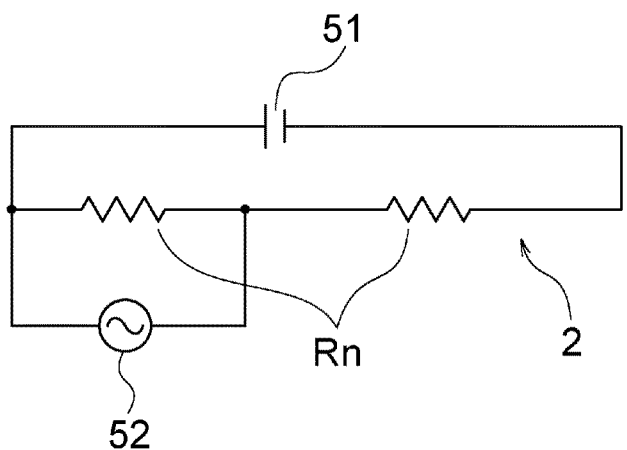
FIG. 10D is a schematic view showing still another non-limiting aspect of the disclosure.

FIG. 10A to FIG. 10D are schematic views showing various non-limiting aspects of the disclosure. Specifically, FIG. 10A to FIG. 10C are cross-sectional views corresponding to FIG. 4. FIG. 10D is a schematic circuit diagram of the heater system. Note that, in FIG. 10A to FIG. 10C, as the route of the resistance heating element 2, the one in the first non-limiting embodiment is shown. However, these non-limiting aspects of the disclosure may be applied to the second non-limiting embodiment as well.

Like in a ceramic heater 310 shown in FIG. 10A, the resistance heating element 2 may be positioned not inside a ceramic substrate 301, but on the surface (lower surface) of the ceramic substrate 301 as well. From another viewpoint, the ceramic substrate 301 may be configured by only (the ceramic layer corresponding to) the first ceramic layer 1a in the first non-limiting embodiment.

Further, from another viewpoint, as in the ceramic heater 310, the connection conductors 3, wirings 4, and terminals 5 (terminals 5 are via conductors from another viewpoint) shown in the first non-limiting embodiment need not be provided, but the power supply parts (P and D) may function as the terminals. Further, as understood from this non-limiting aspect of the disclosure, the terminals need not be positioned on the center side of the ceramic heater when viewed on a plane or the pipe 10b need not be provided either.

Note that, although not particularly shown, on the lower surface of the ceramic heater 310, an insulation layer made of a material (for example a resin having a relatively high heat resistance) different from a ceramic may be provided so as to cover the resistance heating element 2 while leaving the power supply parts exposed as well. In other words, the resistance heating element 2 need not be buried in the ceramic substrate 301, but may be buried in an insulation base body configured by the ceramic substrate 301 and a not shown insulation layer as well.

As in the ceramic heater 410 shown in FIG. 10B, even though the resistance heating element 2 is buried in a ceramic substrate 401, in the same way as FIG. 10A, the power supply parts (P and D) may function as the terminals as well. From another viewpoint, the ceramic substrate 401 may be configured by only (the ceramic layers corresponding to) the first ceramic layer 1a and second ceramic layer 1b in the first non-limiting embodiment. The power supply parts acting also as the terminals are exposed from the lower surface of the ceramic substrate 401 to the outside of the ceramic substrate 401 by formation of holes 401h for leaving the power supply parts exposed in the second ceramic layer 1b.

Note that, although not particularly shown, the terminals 5 (via conductors from another viewpoint) may be arranged in the internal portions of the holes 401h as well.

Like in the ceramic heater 510 shown in FIG. 10C, the wirings 4 need not be positioned in the internal portion of the ceramic substrate 501, but may be positioned on the surface (lower surface) of the ceramic substrate 501 as well. From another viewpoint, the ceramic substrate 501 may be configured only by (the ceramic layers corresponding to) the first ceramic layer 1a and second ceramic layer 1b in the first non-limiting embodiment as well.

Further, from another viewpoint, as shown in FIG. 10C, the end parts of the wirings 4 may function as the terminals 5 as well. Note that, the portion other than the parts functioning as the terminals 5 may be defined as the wirings 4 as well. In FIG. 10C, an insulation layer (for example solder resist) 507 which leaves the parts in the wirings 4 which become the terminals 5 exposed while covers the wirings 4 is provided. However, such an insulation layer 507 is not an essential one.

Although not particularly shown, in the same way as the insulation layer 507 leaving a portion of the wiring 4 exposed, in the first non-limiting embodiment, the third ceramic layer 1c may leave portions of the wiring 4 exposed and the exposed portions may function as the terminals 5 as well.

As shown in FIG. 10D, the additional driving part 52 does not have to supply additional power to all of the plurality of divided regions Rn which are obtained by dividing the resistance heating element 2, but may supply the additional power with respect to only a portion of the plurality of divided regions Rn (one or two or more and a number which is not all) as well. In the example shown, the additional power is supplied to only one of the two divided regions Rn.

In this case, for example, in comparison with the case where the additional power is supplied to all of the plurality of divided regions Rn, the configuration of the additional driving part 52 is simplified. Further, for example, additional power is superimposed on the main power only in the region where the temperature is hard to rise in the ceramic heater to thereby make the temperature uniform.

Although not particularly shown, it is also possible to make the number of the powers to be superimposed different according to the divided region. For example, the first additional power is superimposed with respect to the main power in the first divided region R1 and second divided region R2, and the second additional power is further superimposed in the second divided region R2.

Examples of Application

Figure 11A:
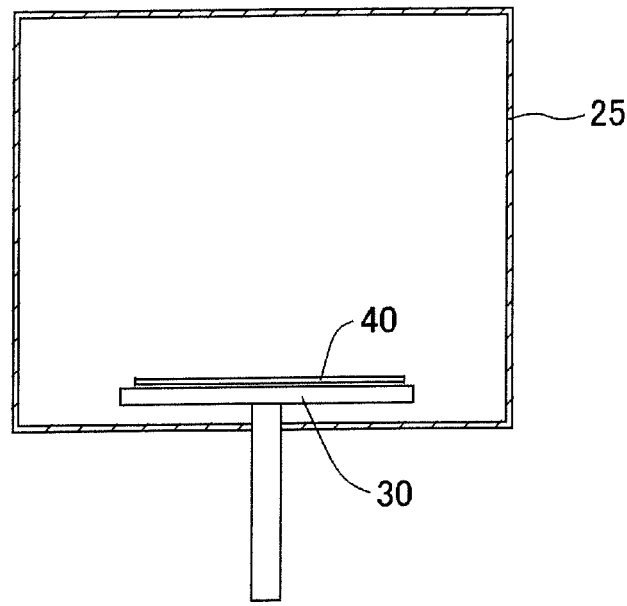
FIG. 11A is a view showing an example of application to which a heater system in the present disclosure is applied.

FIG. 11A is a view showing an example of application to which the heater system in the present disclosure is applied. FIG. 11A shows a situation providing a ceramic heater 30 according to the present disclosure in a chamber 25 of a semiconductor manufacturing apparatus. On the upper surface of the ceramic heater 30, a wafer 40 as a heated object is placed.

Figure 11B:
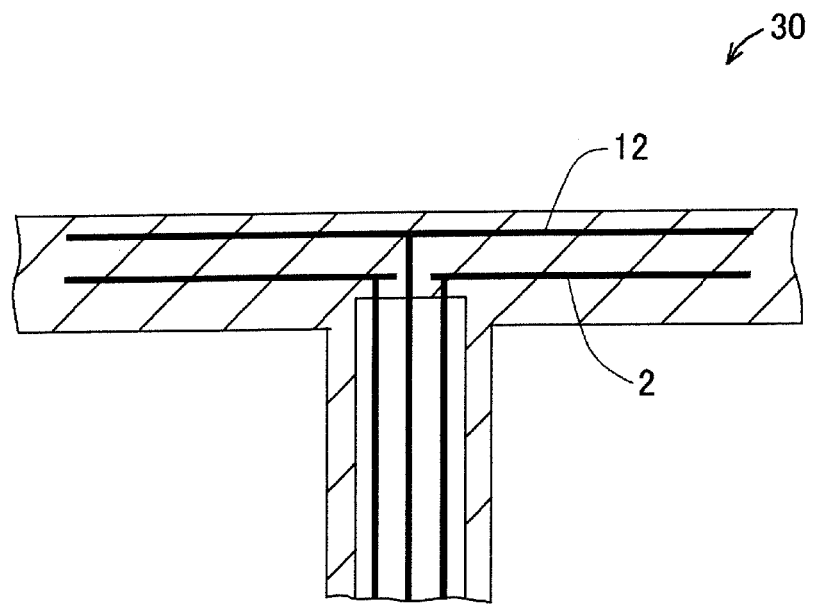
FIG. 11B is a view for explaining details of the example of application.

FIG. 11B is a schematic view showing the configuration of the ceramic heater 30. The ceramic heater 30, for example, is given the same configuration as any of the ceramic heaters according to various non-limiting embodiments or aspects of the disclosure explained above or given a configuration obtained by adding an electrode 12 etc. to the same configuration.

The electrode 12 is for example a plasma treatment-use electrode (for example RF (radio frequency) electrode). In this case, a system including the ceramic heater 30, drive device 50, not shown drive device which applies voltage to the plasma treatment-use electrode, etc. configures the plasma treatment system.

Further, the electrode 12 is for example an electrostatic chuck-use electrode. In this case, the ceramic heater 30 configures the electrostatic chuck. Further, a system including the ceramic heater 30, drive device 50, and a not shown drive device which applies voltage to the electrostatic chuck-use electrode configures the adsorption system.

Further, the ceramic heater 30 may be applied to a hot press heater utilized in a CVD process in manufacture of a semiconductor as well.

The art according to the present disclosure is not limited to the above embodiments and aspects of the disclosure etc. and may be worked in various ways.

For example, the wiring 4 need not be parallel with respect to the resistance heating element 2 either. The ceramic heater having such a configuration for example can be manufactured by preparing a sintered body (ceramic substrate 1) by a hot press method and burying wires which becomes the wirings 4 at that time.

The connection conductor 3 is not limited to one configured by a plurality of divided conductors 3a and may be configured by one via conductor as well. The capacitor C or isolation transformer T need not be provided either.

REFERENCE SIGNS LIST

1 . . . ceramic substrate, 2 . . . resistance heating element, 10 . . . ceramic heater, 10c . . . upper surface (predetermined surface), 50 . . . drive device, 51 . . . main driving part, and 52 . . . additional driving part.

What is claimed is:
1. A heater system comprising:
a heater comprising:
  a ceramic substrate comprising a predetermined surface, and
  a resistance heating element extending along the predetermined surface in an internal portion of the ceramic substrate, or on a surface of the ceramic substrate; and
a drive device which is configured to supply power to the resistance heating element, the drive device comprising:
  a main driving part which is configured to supply a first power to an entirety of a predetermined first region in the resistance heating element so that current flows from one end of the first region to another end of the first region, and
  an additional driving part which is configured to supply a second power, superimposed on the first power, to a second region which is a portion of the first region.
2. The heater system according to claim 1, wherein the second region comprises a plurality of second regions obtained by dividing the first region into the plurality of second regions, and wherein the additional driving part is configured to individually control the second power supplied to each of the plurality of second regions.
3. The heater system according to claim 1, wherein:
the first power is a DC power and the second power is an AC power, or
the first power is an AC power and the second power is an AC power having a higher frequency than the first power.
4. The heater system according to claim 3, wherein the drive device comprises a capacitor connected in series between the additional driving part and the second region.
5. The heater system according to claim 1, wherein the additional driving part is configured to control a voltage of AC power as the second power corresponding to a temperature of the heater, and
the drive device further comprises an isolation transformer which is configured to transfer the second power supplied from the additional driving part with a constant transformation ratio to the second region regardless of the temperature of the heater.
6. The heater system according to claim 1, wherein the main driving part is configured to control the first power based on a change of a resistance value in the first region of the resistance heating element.
7. The heater system according to claim 1, wherein the additional driving part is configured to control the second power based on a change of a resistance value in the second region of the resistance heating element.
8. The heater system according to claim 1, wherein at least one of a plurality of power supply parts, which are positioned at least at two ends of the first region and at an end of the second region, is located outside of a terminal arrangement region, the terminal arrangement region in a center portion of the ceramic substrate in a planar view of the predetermined surface;
the heater comprises:
  a plurality of terminals which are electrically connected to the plurality of power supply parts, are exposed to the outside of the ceramic substrate to a side opposite to the predetermined surface, and are located in the terminal arrangement region in the planar view of the predetermined surface;
  a connection conductor which projects from the at least one of the plurality of power supply parts, located outside of the terminal arrangement region, to the side opposite to the predetermined surface; and
  a wiring which extends from the connection conductor to the inside of the terminal arrangement region in the internal portion or on the surface of the ceramic substrate on the side opposite to the predetermined surface with respect to the resistance heating element and is connected to any of the plurality of terminals, and
the drive device is connected to the plurality of terminals.
9. The heater system according to claim 8, wherein the wiring extends parallel to the predetermined surface.
10. The heater system according to claim 8, wherein an area of a lateral cross-section of the wiring is larger than an area of a lateral cross-section of the resistance heating element.
11. The heater system according to claim 8, wherein the connection conductor connecting the at least one of the plurality of power supply parts and the wiring, the connection conductor comprising a plurality of divided conductors which are connected in parallel between the at least one of the plurality of power supply parts and the wiring so that the divided conductors are located along a route of the resistance heating element.

12. The heater system according to claim 1, wherein the drive device further comprises:
an isolation transformer which is configured to transfer the second power supplied from the additional driving part to the second region, and
a capacitor connected in series between the additional driving part and the second region.

13. A ceramic heater comprising:
a ceramic substrate comprising a predetermined surface;
a resistance heating element which comprises:
a first region extending along the predetermined surface inside the ceramic substrate, in which at least one of a plurality of power supply parts, which are located at least at two ends and an intermediate position of the first region, is located outside of a terminal arrangement region which is in a center portion of the ceramic substrate in a planar view of the predetermined surface; and
a plurality of second regions forming subsections of the first region, each of the plurality of second regions having a corresponding power supply part of the plurality of power supply parts, which are located at differing intermediate positions of the first region;
a plurality of terminals which are electrically connected to the plurality of power supply parts, are exposed to the outside of the ceramic substrate to a side opposite to the predetermined surface, and are located in the terminal arrangement region in the planar view of the predetermined surface;
a connection conductor which projects from the at least one of the plurality of power supply parts located outside of the terminal arrangement region, to the side opposite to the predetermined surface;
a wiring which extends from the connection conductor to the inside of the terminal arrangement region on the side opposite to the predetermined surface with respect to the resistance heating element, and in an internal portion or on a surface of the ceramic substrate, and is connected to any of the plurality of terminals; and
the connection conductor connecting the wiring and at least one of the plurality of power supply parts that corresponds to a second region of the plurality of second regions, the connection conductor comprising a plurality of divided conductors which are connected in parallel between the at least one of the plurality of power supply parts and the wiring so that the plurality of divided conductors are located sequentially along a longitudinal axis of the resistance heating element within each respective second region of the plurality of second regions.

14. The ceramic heater of claim 13,
wherein a diameter of each divided conductor of the plurality of divided conductors is substantially equal to a width of the resistance heating element.

15. A ceramic heater comprising:
a ceramic substrate;
a resistance heating element; and
at least three electrodes comprising a first electrode to an n-th electrode which are configured to supply power to the resistance heating element, wherein
the first electrode and the n-th electrode are electrodes between which a first power is configured to be supplied so that current flows from the first electrode to the n-th electrode, and
two adjoining electrodes of the at least three electrodes in the resistance heating element are electrodes between which a second power is configured to be supplied.

16. A plasma treatment system comprising:
a heater system comprising:
a heater comprising:
a ceramic substrate comprising a predetermined surface, and
a resistance heating element extending along the predetermined surface in an internal portion of the ceramic substrate, or on a surface of the ceramic substrate; and
a drive device which is configured to supply power to the resistance heating element, the drive device comprising:
a main driving part which is configured to supply a first power to an entirety of a predetermined first region in the resistance heating element so that current flows from one end of the first region to another end of the first region, and
an additional driving part which is configured to supply a second power, superimposed on the first power, to a second region which is at least a portion of the first region; and
a plasma treatment-use electrode located inside the ceramic substrate.

17. An adsorption system comprising:
a heater system comprising:
a heater comprising:
a ceramic substrate comprising a predetermined surface, and
a resistance heating element extending along the predetermined surface in an internal portion of the ceramic substrate, or on a surface of the ceramic substrate; and
a drive device which is configured to supply power to the resistance heating element, the drive device comprising:
a main driving part which is configured to supply a first power to an entirety of a predetermined first region in the resistance heating element so that current flows from one end of the first region to another end of the first region, and
an additional driving part which is configured to supply a second power, superimposed on the first power, to a second region which is at least a portion of the first region; and
an electrostatic chuck-use electrode located inside the ceramic substrate.

* * * * *